United States Patent
Hamaguchi

(10) Patent No.: US 7,605,043 B2
(45) Date of Patent: Oct. 20, 2009

(54) SEMICONDUCTOR DEVICE AND MANUFACTURING METHOD FOR THE SAME

(75) Inventor: Masafumi Hamaguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/826,117

(22) Filed: Jul. 12, 2007

(65) Prior Publication Data

US 2008/0176373 A1 Jul. 24, 2008

Related U.S. Application Data

(62) Division of application No. 11/079,520, filed on Mar. 15, 2005, now Pat. No. 7,271,443.

(30) Foreign Application Priority Data

Aug. 25, 2004 (JP) .............................. 2004-245293

(51) Int. Cl.
*H01L 21/336* (2006.01)
(52) U.S. Cl. ...................... 438/301; 438/283; 438/303
(58) Field of Classification Search ................. 438/283, 438/301, 303, 304
See application file for complete search history.

(56) References Cited

U.S. PATENT DOCUMENTS

| | | | |
|---|---|---|---|
| 5,514,902 A | 5/1996 | Kawasaki et al. | |
| 5,677,213 A | 10/1997 | Lee | |
| 5,885,886 A * | 3/1999 | Lee | 438/528 |
| 6,174,778 B1 | 1/2001 | Chen et al. | |
| 6,335,233 B1 * | 1/2002 | Cho et al. | 438/199 |
| 6,696,729 B2 | 2/2004 | Adachi | |
| 6,734,070 B1 * | 5/2004 | Takahashi | 438/300 |
| 2004/0132249 A1 | 7/2004 | Mitsuda et al. | |
| 2005/0242399 A1 * | 11/2005 | Huang | 257/355 |

FOREIGN PATENT DOCUMENTS

| | | |
|---|---|---|
| CN | 1138748 A | 12/1996 |
| JP | 01-245519 A | 9/1989 |
| JP | 04-287332 A | 10/1992 |
| JP | 08-078674 A | 3/1996 |

OTHER PUBLICATIONS

M. Hamaguchi, U.S. PTO Office Action, U.S. Appl. No. 11/928,750, May 6, 2008, p. 8.
H. Fukutome et al., "Fluorine Implantation Impart in Extension Region on the Electrical Performance of Sub-50nm P-MOSFETs", IEEE, 2003, 4 pages.
M. Hamaguchi et al., "Fluorine or Nitrogen Ion Implantation for the Suppression of Baron Diffusion", Extended Abstracts (The 51st Spring Meeting, 2004); The Japan Society of Applied Physics and Related Societies, Mar. 28, 2004, pp. 79 and 965, No. 2.
M. Hamaguchi, U.S. PTO Notice of Allowance, U.S. Appl. No. 11/928,750, Nov. 24, 2008, 5 pgs.
J. M. Jacques, et al., "Fluorine-enhanced boron diffusion in amorphous silicon," Applied Physics Letters, vol. 82, No. 20, May 19, 2003, pp. 3469-3471.

* cited by examiner

*Primary Examiner*—Phuc T Dang
(74) *Attorney, Agent, or Firm*—Foley & Lardner LLP

(57) ABSTRACT

A semiconductor device includes a first diffusion region including germanium atoms and first impurity atoms, provided on a surface layer of a semiconductor substrate, the first impurity atoms contributing to electric conductivity, and a second diffusion region including second impurity atoms, provided shallower than the first diffusion region from a surface of the first diffusion region, the second impurity atoms not contributing to the electric conductivity.

20 Claims, 26 Drawing Sheets

SEMICONDUCTOR DEVICE AND MANUFACTURING METHOD FOR THE SAME

CROSS REFERENCE TO RELATED APPLICATIONS

The present application is a divisional of U.S. application Ser. No. 11/079,520, filed Mar. 15, 2005, the entire contents of which is incorporated herein by reference.

This application is based upon and claims the benefit of priority from prior Japanese Patent Application P2004-245293 filed on Aug. 25, 2004; the entire contents of which are incorporated by reference herein.

BACKGROUND OF THE INVENTION

1. Field of the Invention

The present invention relates to a semiconductor device and a manufacturing method for the semiconductor device, and particularly, relates to a semiconductor device having an active region provided by ion implantation and a manufacturing method for the semiconductor device.

2. Description of the Related Art

Control of the impurity distribution in a semiconductor layer is extremely important. For example, in a minute metal-oxide-semiconductor (MOS) transistor fabricated on a silicon (Si) semiconductor substrate, an impurity diffusion layer is required to be formed to have a shallow and abrupt impurity profile to achieve a high drive current, and to suppress a short channel effect.

For example, in source/drain extension regions of a MOS transistor, a shallow pn junction must be formed with a thickness of or less than twenty nm from a surface of a semiconductor substrate. In order to form a shallow pn junction, a shallow impurity doped region is required. In the formation of a shallow impurity doped region, ions of an impurity are implanted into a semiconductor substrate at low acceleration energy and a low dose. The impurities implanted into the semiconductor substrate are activated by annealing so as to form a shallow impurity diffusion region.

For example, the diffusion coefficients of p-type impurities such as boron (B), and n-type impurities such as phosphorus (P) or arsenic (As) in the crystal of the Si semiconductor substrate are large. Impurities diffuse out to both the interior and exterior of a semiconductor substrate due to the high temperature of activation annealing, such as rapid thermal annealing (RTA). Therefore, it is difficult to form a shallow impurity diffusion region with a high concentration of impurities in a semiconductor substrate. On the other hand, if activation annealing temperature is decreased in order to suppress diffusion of impurities, a high concentration of impurities may not be activated.

A method for co-implanting ions of nitrogen (N) or molecular nitrogen ($N_2$), and B ions has been suggested as a way of suppressing the diffusion of impurities (refer to Japanese Patent Gazette No. 3442154). However, there is a concern that accelerated diffusion of B ions will occur due to point defects generated by the implantation of the $N^+$ and $N_2^+$. Therefore, it is difficult to form a shallow impurity diffusion region having low resistance and a high concentration of activated impurities.

SUMMARY OF THE INVENTION

A first aspect of the present invention inheres in a semiconductor device including a first diffusion region including germanium atoms and first impurity atoms, provided on a surface layer of a semiconductor substrate, the first impurity atoms contributing to electric conductivity; and a second diffusion region including second impurity atoms, provided at a depth more shallow than the first diffusion region from a surface of the first diffusion region, the second impurity atoms not contributing to the electric conductivity.

A second aspect of the present invention inheres in a method for manufacturing a semiconductor device including forming an amorphous region in a surface region of a semiconductor substrate by implanting one of germanium ions and silicon ions; implanting ions of first impurity atoms into the amorphous region, the first impurity atoms contributing to electric conductivity; implanting ions of second impurity atoms into the amorphous region, the second impurity atoms not contributing to the electric conductivity; and activating the ions of the first impurity atoms by annealing the surface region of the semiconductor substrate.

A third aspect of the present invention inheres in a method for manufacturing a semiconductor device including forming a gate insulating film on a surface of a semiconductor substrate and a gate electrode on the gate insulating film; forming an amorphous region on both sides of the gate insulating film in a surface region of the semiconductor substrate by implanting one of germanium ions and silicon ions; forming a first impurity implanted region by implanting ions of first impurity atoms into the amorphous region, the first impurity atoms contributing to electric conductivity; implanting ions of second impurity atoms into the amorphous region, the second impurity atoms not contributing to the electric conductivity; and activating the ions of the first impurity atoms by annealing the surface region of the semiconductor substrate.

DETAILED DESCRIPTION OF THE INVENTION

Figure 1:
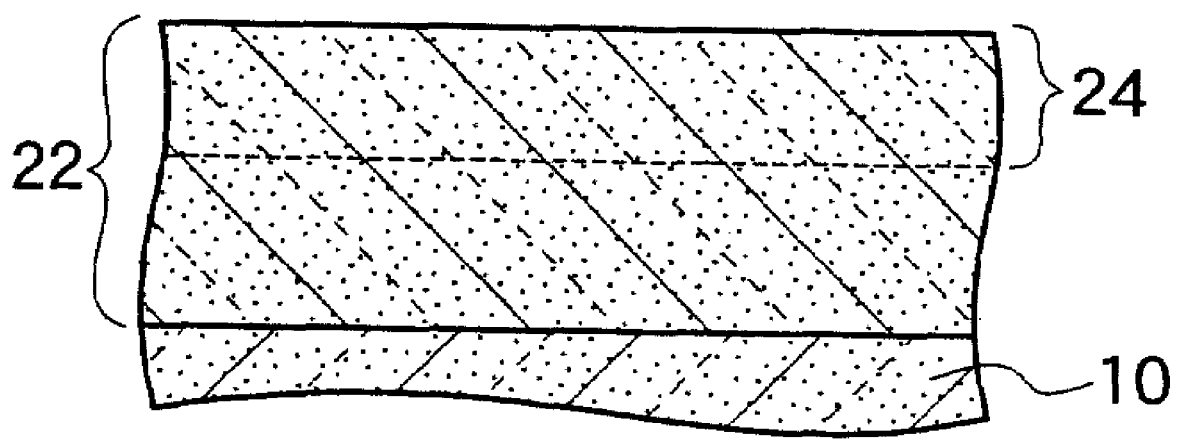
FIG. 1 is a cross sectional view showing an example of a semiconductor device according to the embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

A semiconductor device according to the embodiment of the present invention includes a first diffusion region 22 provided on a surface layer of a semiconductor substrate 10, and a second diffusion region 24 provided at a more shallow depth than the first diffusion region 22 from a surface of the first diffusion region 22, as shown in FIG. 1. In order to form a pn junction with the semiconductor substrate 10, the first diffusion region 22 includes first impurity atoms which contributes to electric conductivity. According to the type of conductivity of the semiconductor substrate 10, impurity atoms introduced at a donor level formed with shallow level below the bottom of the conduction band or an acceptor level formed with shallow level above the top of the valence band, in the bandgap of the band structure of a semiconductor crystal is used as the first impurity atoms. For example, a p-type impurity atom such as B, and an n-type impurity atom such as P are used for the silicon crystal serving as a host semiconductor. Additionally, the first diffusion region 22 includes germanium (Ge). Ge may be distributed in the semiconductor substrate 10 outside of the first diffusion region 22. Further, the second diffusion region 24 includes second impurity atoms which do not contribute to electric conductivity. The second impurity atoms may be fluorine (F), N, and the like.

Depth of the first diffusion region 22 is 100 nm or less, desirably 50 nm or less, and even more desirably 30 nm or less, for example. Depth ratio of the second diffusion region 24 to the first diffusion region 22 is 0.1 or above and below 1, and desirably 0.25 or above and 0.5 or below.

Next, an impurity doping method for forming a pn junction with B and F as the first and second impurities doped into the Si n-type semiconductor substrate 10, will be described. A p-MOS transistor is the semiconductor device of interest. Impurity doping and annealing on source/drain extension regions of a p-MOS transistor will be the main focuses of the description. Description of manufacturing processes such as photolithography, etching and the like, has been omitted.

Figure 2:
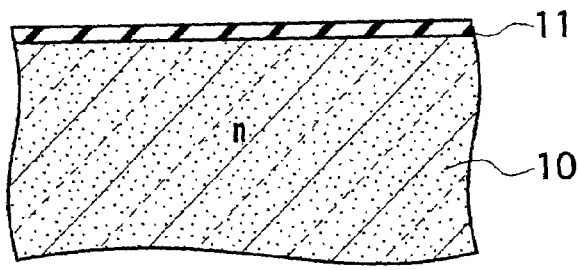
FIGS. 2 to 8 are cross sectional views showing an example of an impurity doping method according to the embodiment of the present invention.
Figure 3:
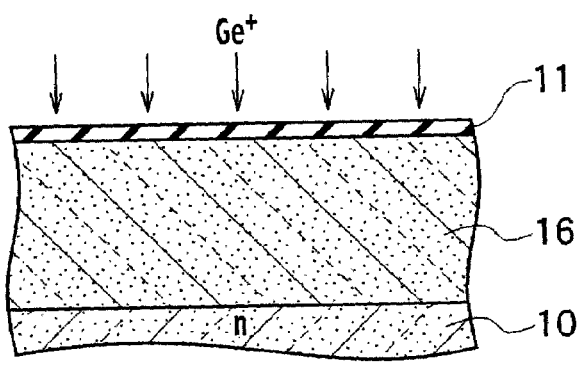

As shown in FIG. 2, an oxide film 11 of silicon dioxide ($SiO_2$) is formed by thermal oxidation on a surface of then-type semiconductor substrate 10 at a thickness of approximately one nm. As shown in FIG. 3, Ge pre-amorphization implantation (PAI) is executed through the oxide film 11. Ion implantation conditions are an acceleration energy of five keV and a dose of $1 \times 10^{15}$ $cm^{-2}$, for example. A projected range of Ge is approximately eight nm. Here, the term of "projected range" is defined as a depth where the most implanted ions stop in the target material. An amorphous region 16 is formed at an approximately sixteen nm depth from the interface of the oxide film 11 and the semiconductor substrate 10 due to damage caused by the Ge PAI. In addition, in the embodiment Ge is used for PAI. However, it is also possible to implant Si ions for PAI.

Figure 4:
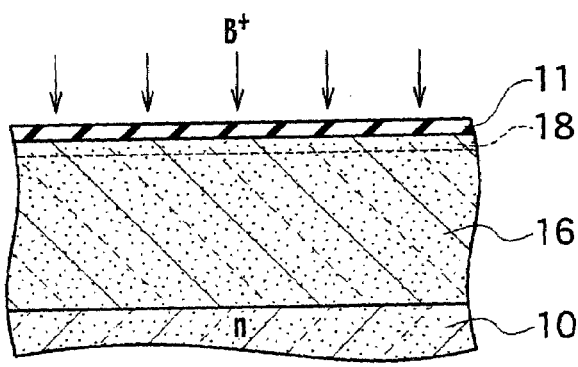

As shown in FIG. 4, $B^+$ is implanted into the amorphous region 16 through the oxide film 11, to form a first impurity implanted region 18. The ion implantation conditions are an acceleration energy of 0.2 keV and a dose of $1 \times 10^{15}$ $cm^{-2}$, for example. The projected range of the implanted $B^+$ is at a depth of two nm from the surface of the amorphous region 16.

Figure 5:
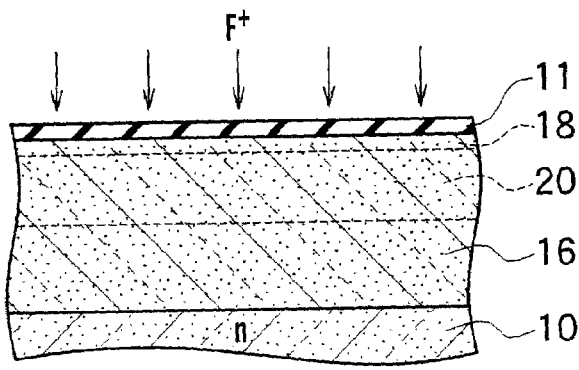

As shown in FIG. 5, $F^+$ is co-implanted into the first impurity implanted region 18 formed in the amorphous region 16 through the oxide film 11. Due to the co-implantation of $F^+$, a second impurity implanted region 20 is formed. The ion implantation conditions are an acceleration energy of 2.5 keV and a dose of $1 \times 10^{15}$ $cm^{-2}$, for example. The projected range of the implanted $F^+$ is at a depth of eight nm from the surface of the amorphous region 16.

Figure 6:
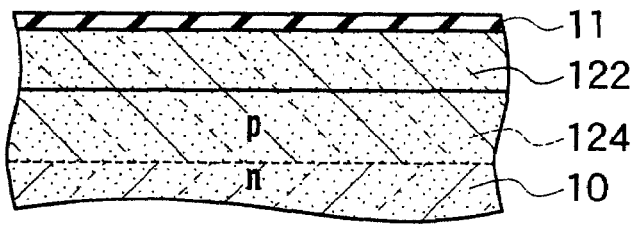

As shown in FIG. 6, the implanted B$^+$ in the first impurity implanted region 18 are electrically activated by RTA while diffusing, to form a p-type B diffusion region 122. Simultaneously, a diffusion region 124 including diffused F is formed deeper than the B diffusion region 122. The activation annealing by RTA is executed under conditions of a temperature of approximately 800° C. to 900° C. for five seconds. The amorphous region 16 shown in FIG. 5 is re-crystallized by the activation annealing.

Figure 7:
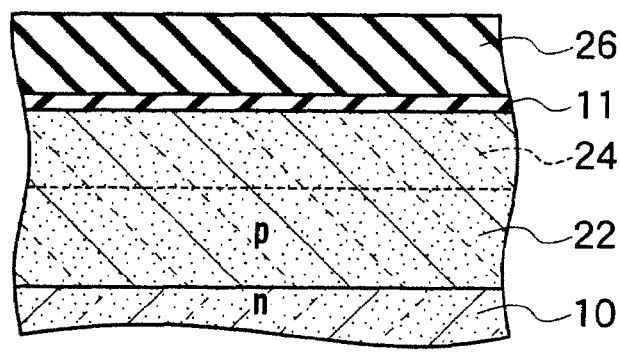
Figure 8:
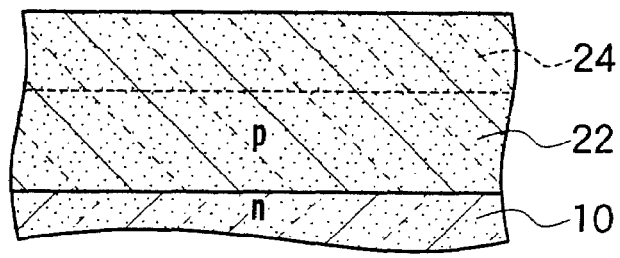

As shown in FIG. 7, an insulating film 26 of a material such as SiO$_2$, silicon nitride (Si$_3$N$_4$), or boron silicate glass (BSG), is deposited on top of the oxide film 11 by chemical vapor deposition (CVD). The temperature of the CVD is between 650° C. and 700° C. Subsequently, activation annealing at approximately 1000° C. to 1080° C. is executed by spike RTA. Here the term "spike RTA" refers to an RTA process that eliminates the time to maintain the highest attained temperature. Afterward, as shown in FIG. 8, the insulating film 26 and the oxide film 11 are removed by wet etching. In this manner, the first diffusion region 22 is formed as an active region of a semiconductor device. The second diffusion region 24 containing both activated B and F is formed on an upper side of the first diffusion region 22.

Recently, a method of activation annealing for implanted impurities by an extremely short pulsed light using a flash lamp, laser and the like, is being suggested as a way to achieve a shallow pn junction. However, many aspects of annealing by an extremely short pulsed light remain unknown. Additionally, when B$^+$ is co-implanted with substances such as F$^+$ or N$^+$, diffusion of B is suppressed to achieve an abrupt impurity distribution. However, point defects such as interstitial Si atoms or vacancies in the Si crystal are generated by ion implantation of F or N. The point defects caused by ion implantation easily tend to form pairs with implanted B impurities. When B impurities are paired with the point defects, the pairs of B and point defect can move around in the silicon crystal relatively easily. Thus, enhanced diffusion of B occurs.

In the embodiments, B and F are co-implanted within the amorphous region 16 formed by Ge PAI. Since the amorphous region 16 does not possess a crystalline structure, the point defects caused by ion implantation may not be generated. As a result, enhanced diffusion of B is suppressed, making it possible to achieve an abrupt impurity distribution and a shallow impurity diffusion region.

In the description put forth above, B$^+$ is implanted into the amorphous region 16 to form the first impurity implanted region 18 before F$^+$ implant. However, if B and F are co-implanted within the amorphous region 16, B$^+$ may be implanted after F$^+$ implant that forms the second impurity implanted region 20.

Figure 9:
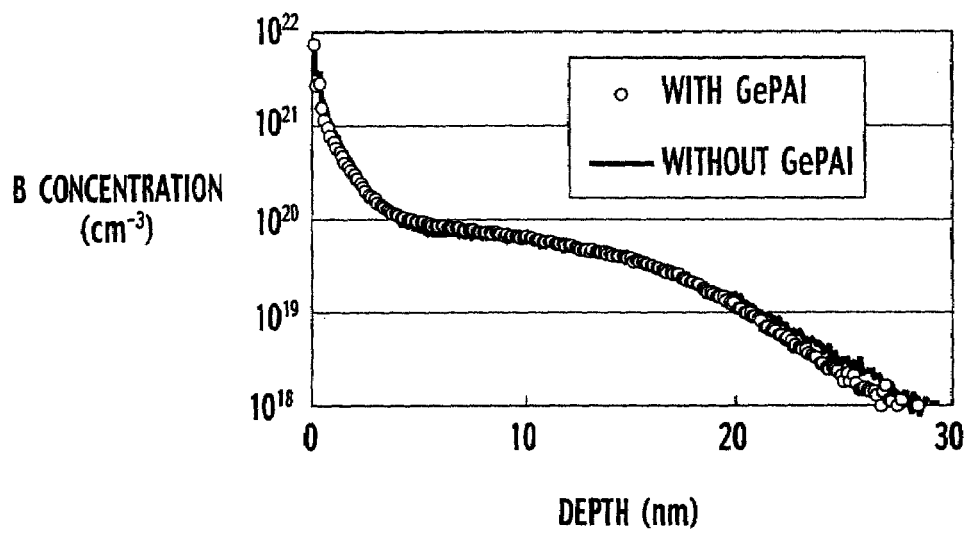
FIG. 9 is a diagram showing an example of B concentration distribution of an active region formed by B and F co-implantation, after activation annealing according to the embodiment of the present invention.
Figure 10:
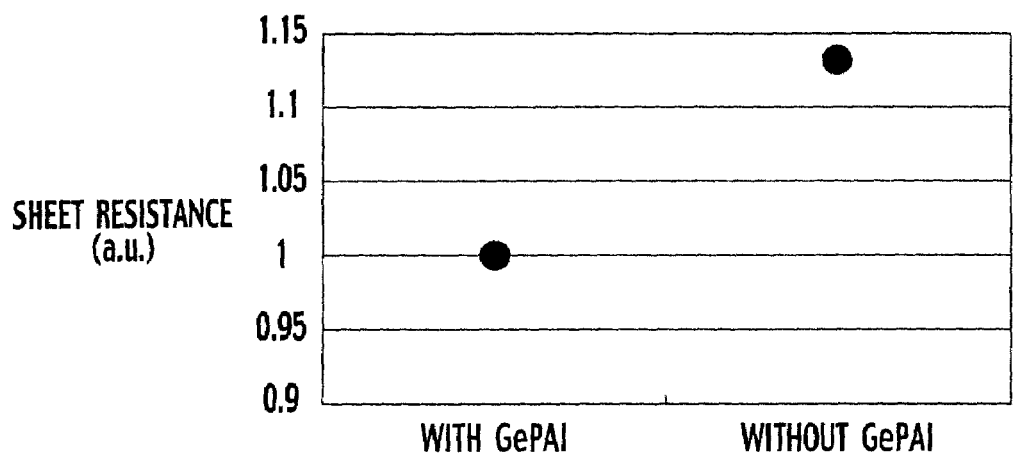
FIG. 10 is a diagram showing an example of sheet resistance of an active region formed by B and F co-implantation, after activation annealing according to the embodiment of the present invention.

As shown in FIG. 9, the concentration of B after spike RTA of an active region (first diffusion region) according to the embodiment is approximately $1 \times 10^{20}$ cm$^{-3}$ at the flat region located near ten nm from the surface. The diffusion depth of B is approximately 27 nm. Here, the concentration distribution of B is measured by secondary ion mass spectrometry (SIMS). The diffusion depth of B corresponds to a position where the concentration of B decreases to $1 \times 10^{18}$ cm$^{-3}$. The concentration distribution of B after spike RTA of an active region formed by B and F co-implantation without Ge PAI is also shown in FIG. 9 as a comparative example. As compared with the concentration distribution of B inactive regions according to the embodiment, the diffusion depth of B in active regions in the comparative example is approximately 28.5 nm deeper. The sheet resistance Rs of the active region according to the comparative example is approximately 13% increased compared to the active region according to the embodiment. Sheet resistance Rs is inversely proportional to activated B concentration and the depth of an active region. Therefore, it is determined that activated B concentration increases by Ge PAI and by B and F co-implantation. In this manner, according to the embodiment, it is possible to achieve an active region with low resistance.

Figure 11:
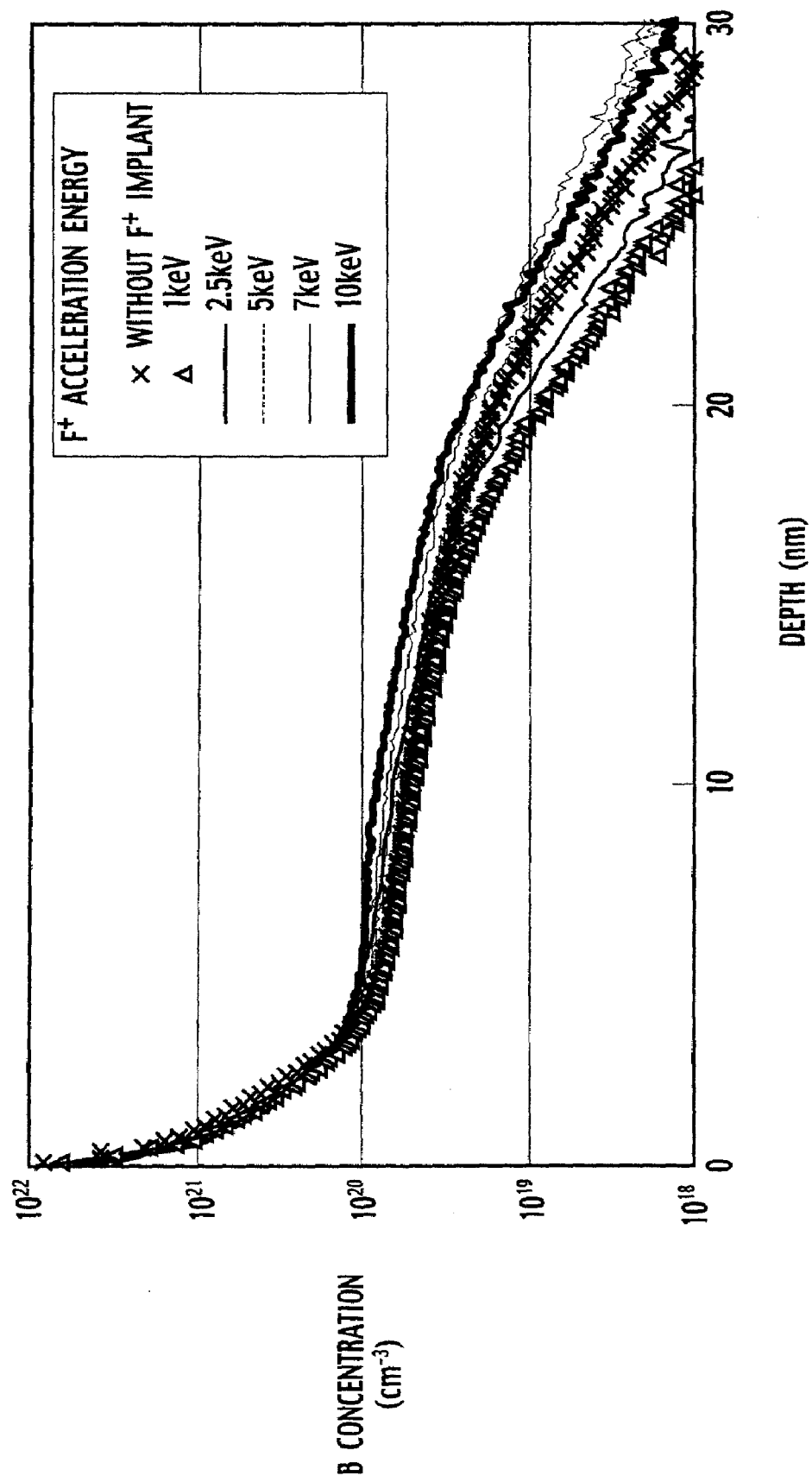
FIG. 11 is a diagram showing examples of B concentration distributions of active regions formed by B and F co-implantation, after activation annealing.

Additionally, as shown in FIG. 11, when acceleration energy of F$^+$ co-implanted with B$^+$ in the amorphous region formed by Ge PAI is changed, concentration distribution of B of the active region after spike RTA change. As an example, compared to the active region formed without F$^+$ implant, an abrupt concentration distribution of B is achieved with the active regions co-implanted at F$^+$ acceleration energy of 2.5 keV and below. The diffusion distances of B in the active regions co-implanted at F$^+$ acceleration energy of 5 keV and above increase compared with the diffusion distance of B in the active region formed without F$^+$ implant. Co-implantation dose ratio of F to B (hereinafter referred to as F/B dose ratio) at a B dose of $1 \times 10^{15}$ cm$^{-2}$, is one.

Figure 12:
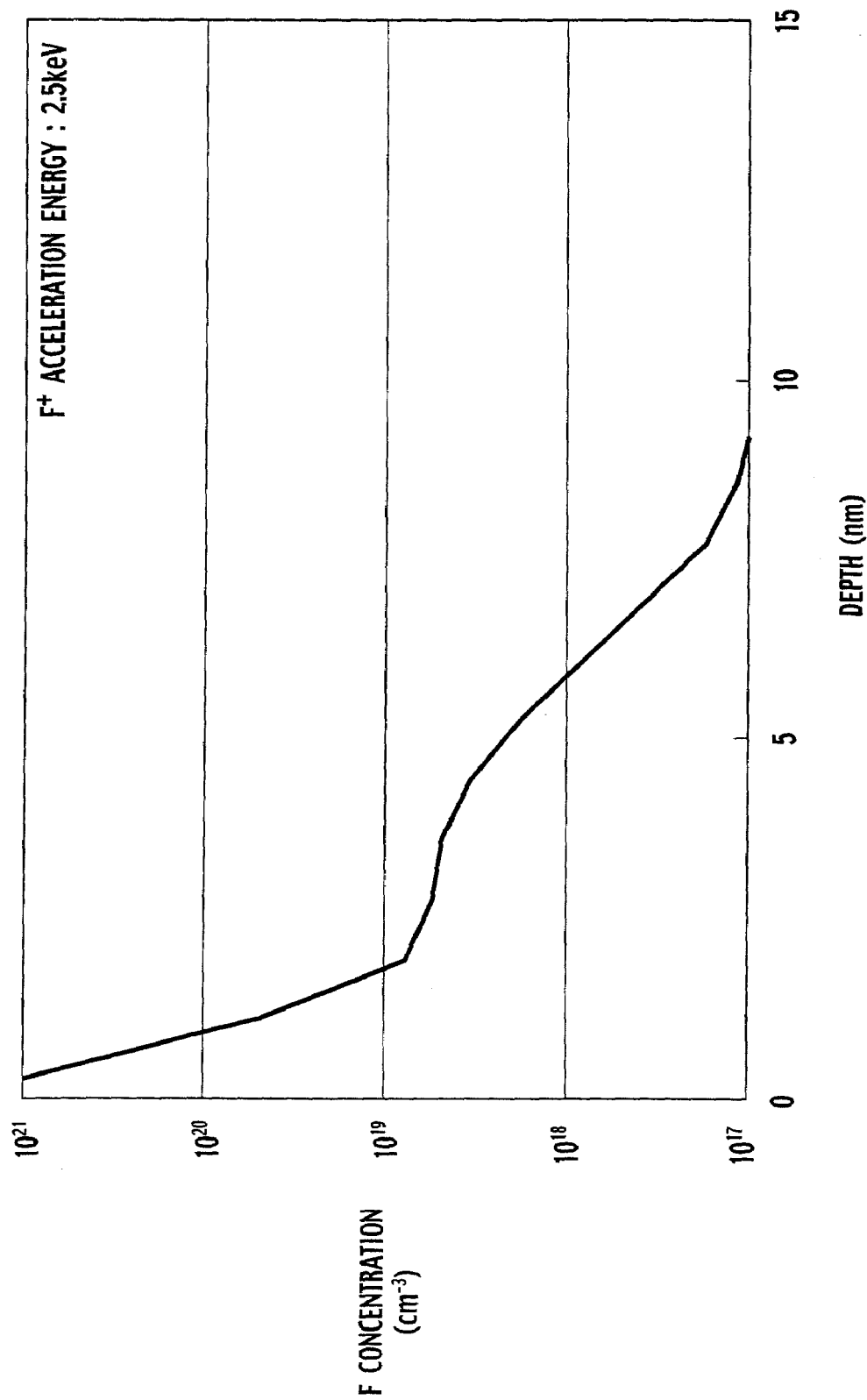
FIG. 12 is a diagram showing an example of F concentration distribution of an active region formed by B and F co-implantation, after activation annealing.
Figure 13:
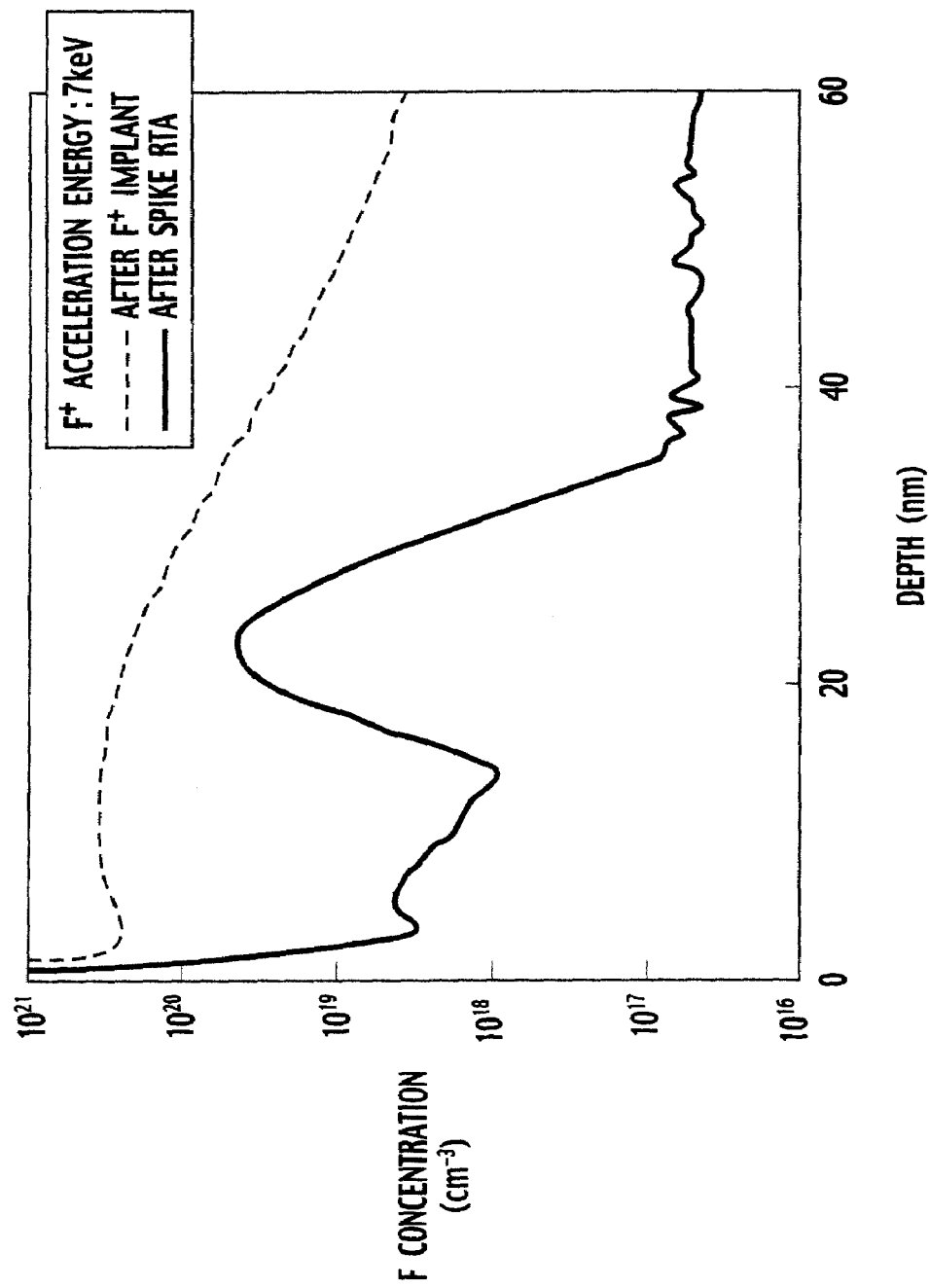
FIG. 13 is a diagram showing an example of F concentration distribution of an active region formed by B and F co-implantation.

In an active region according to the embodiment that has been co-implanted with F$^+$ at an acceleration energy of 2.5 keV, the F ions are diffused to a depth of approximately six nm from the surface of the active region after activation annealing, as shown in FIG. 12. The projected range of the implanted F$^+$ is at a depth of approximately eight nm from the surface of the active region. Therefore, it is determined that the F ions diffuse on the surface side of the active region by activation annealing. On the other hand, in the active region co-implanted with F$^+$ at an acceleration energy of 7 keV, a sharp peak at a depth of approximately 22 nm from the surface of the active region can be observed on the concentration distribution of F after activation annealing, as shown in FIG. 13. The projected range of F ions are approximately 13 nm, and a broad peak can be observed on the concentration distribution of F immediately after F$^+$ implant. Since the depth of the amorphous region by Ge PAI is approximately 16 nm, point defects caused by B and F co-implantation are generated in the Si crystal in regions deeper than the amorphous region. Activation annealing may cause implanted F ions to flocculate to generated point defects. B ions also form pairs with the point defects and diffuse deeply throughout the Si crystal due to enhanced diffusion.

Figure 14:
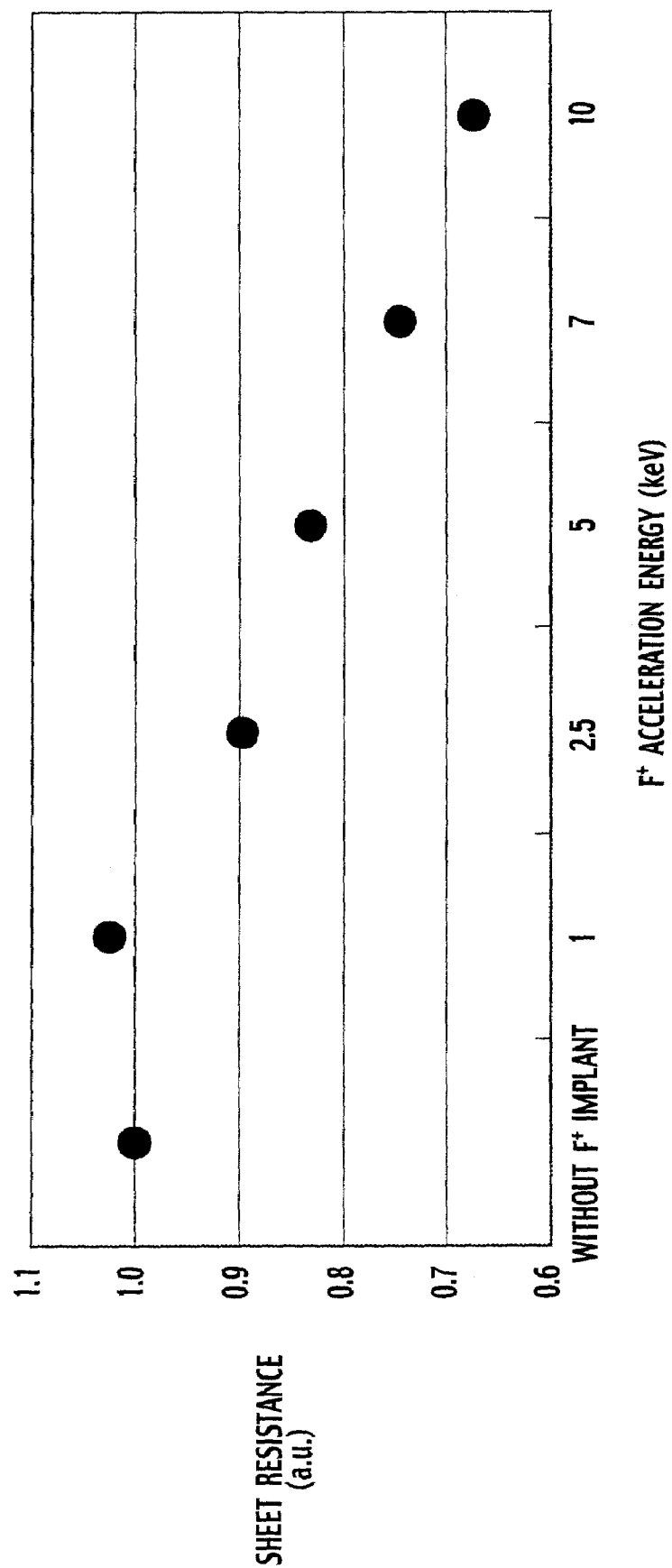
FIG. 14 is a diagram showing an example of a dependence of sheet resistances of active regions formed by B and F co-implantation, after activation annealing, on acceleration energy of F ions.

Sheet resistance Rs of the active region, as shown in FIG. 14, decreases with increases in F$^+$ acceleration energy. For an F$^+$ acceleration energy of one keV and an F/B dose ratio of one, sheet resistance Rs increases by approximately two % compared to the comparative example without F$^+$ implant. However, the diffusion depth of active regions co-implanted with F$^+$ acceleration energy of one keV is approximately ten % shallower than the comparative example without F$^+$ implant, as shown in FIG. 11. By co-implantation with F$^+$ acceleration energy of one keV, resistance may increase. However, considering a difference of the diffusion depth, resistance of the active region may decrease with F$^+$ acceleration energy of one keV, compared to the comparative example. In this manner, with acceleration energy of 2.5 keV and below for F$^+$ co-implanted with B$^+$, it is possible to suppress diffusion of B and to form an active region with low resistance.

Figure 15:
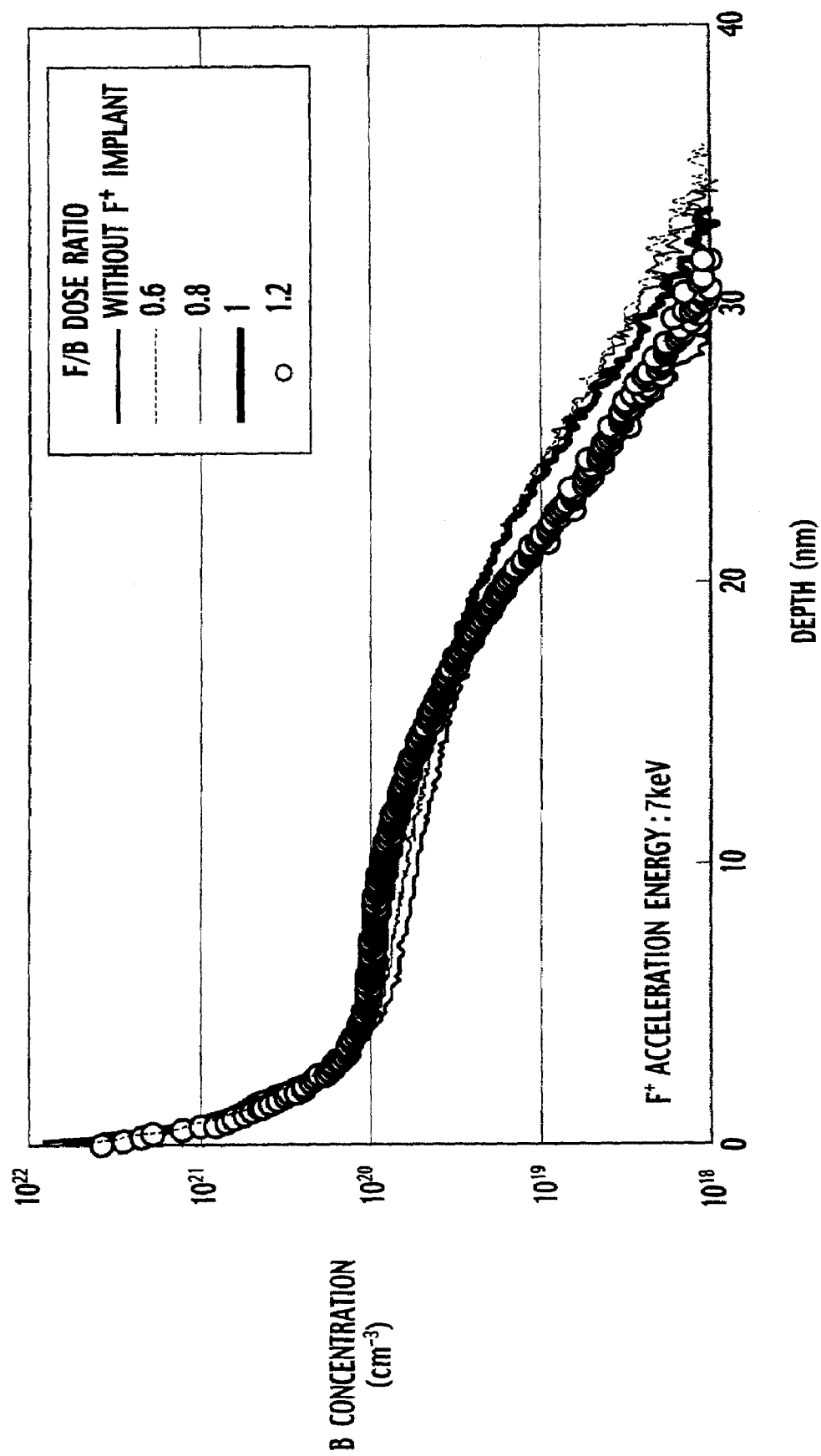
FIG. 15 is a diagram showing an example of a dependence of B concentration distributions of active regions formed by B and F co-implantation F, after activation annealing, on F/B dose ratio.
Figure 16:
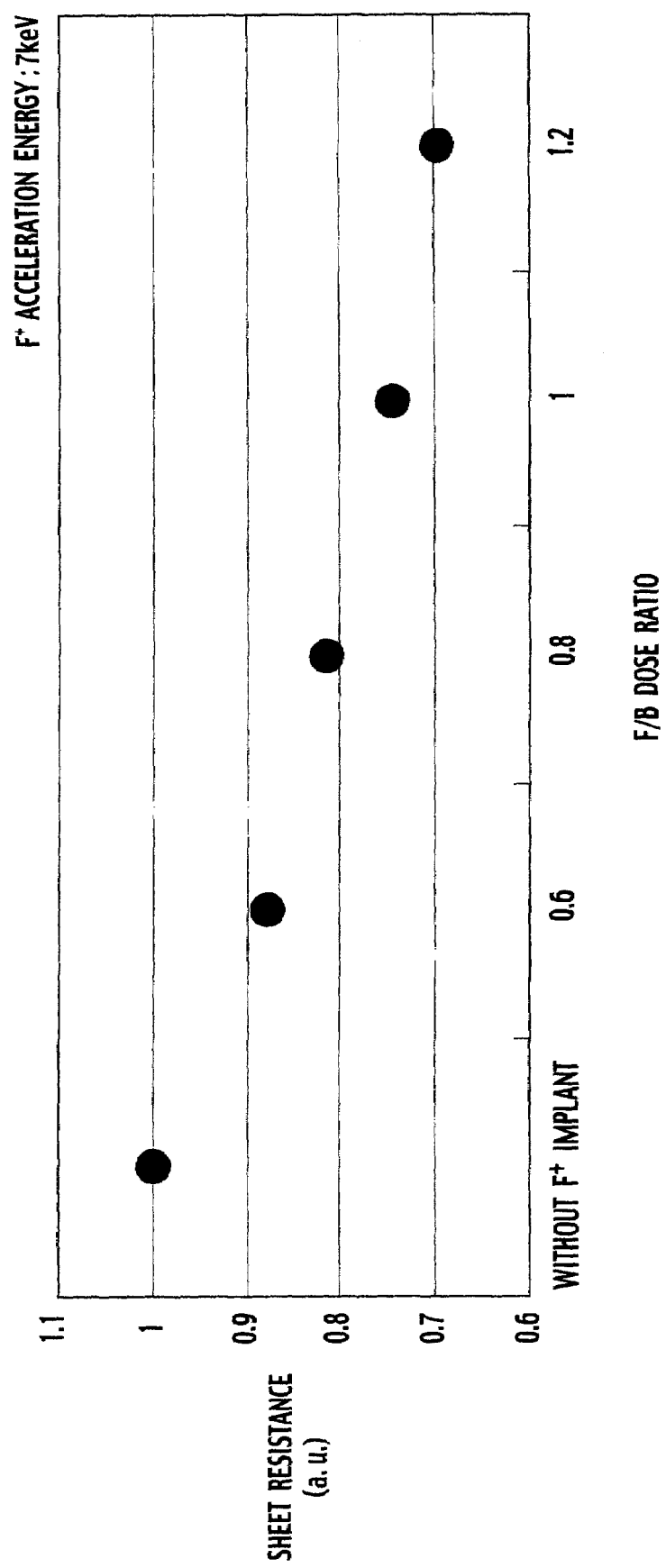
FIG. 16 is a diagram showing an example of a dependence of sheet resistances of active regions formed by B and F co-implantation, after activation annealing, on F/B dose ratio.

As shown in FIG. 15, when the F$^+$ acceleration energy is seven keV, the concentration distribution of B remains virtually unchanged with F/B dose ratio of one or less. When the F/B dose ratio increases to 1.2, the diffusion depth of B is comparable to the comparative example without co-implantation. Sheet resistance Rs decreases in correlation with an increase in the F/B dose ratio, as shown in FIG. 16. With an F/B dose ratio of 1.2, sheet resistance decreases for about 30% compared to the comparative example.

Figure 17:
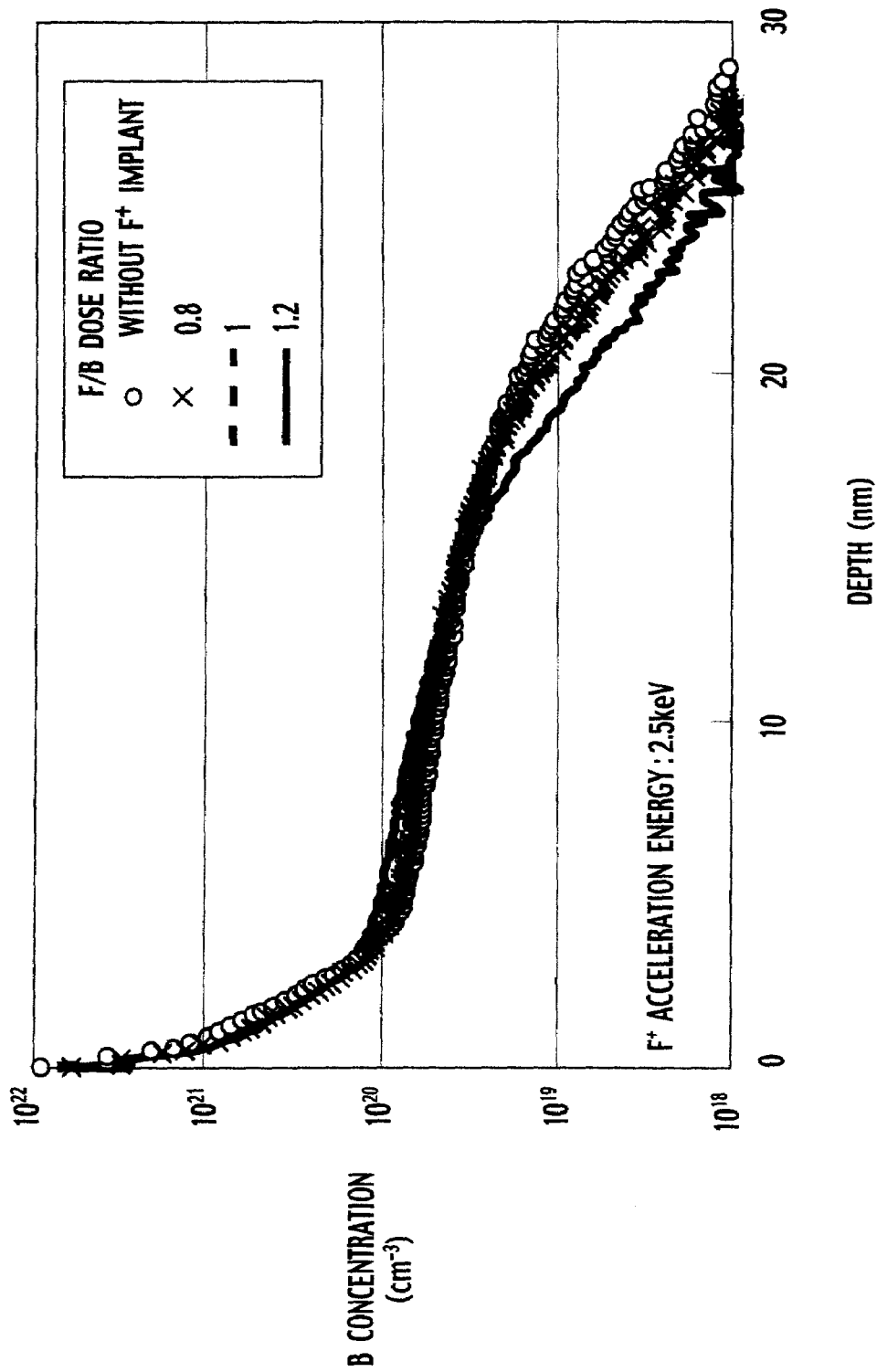
FIG. 17 is a diagram showing other example of a dependence of B concentration distributions of active regions formed by B and F co-implantation, after activation annealing, on F/B dose ratio.
Figure 18:
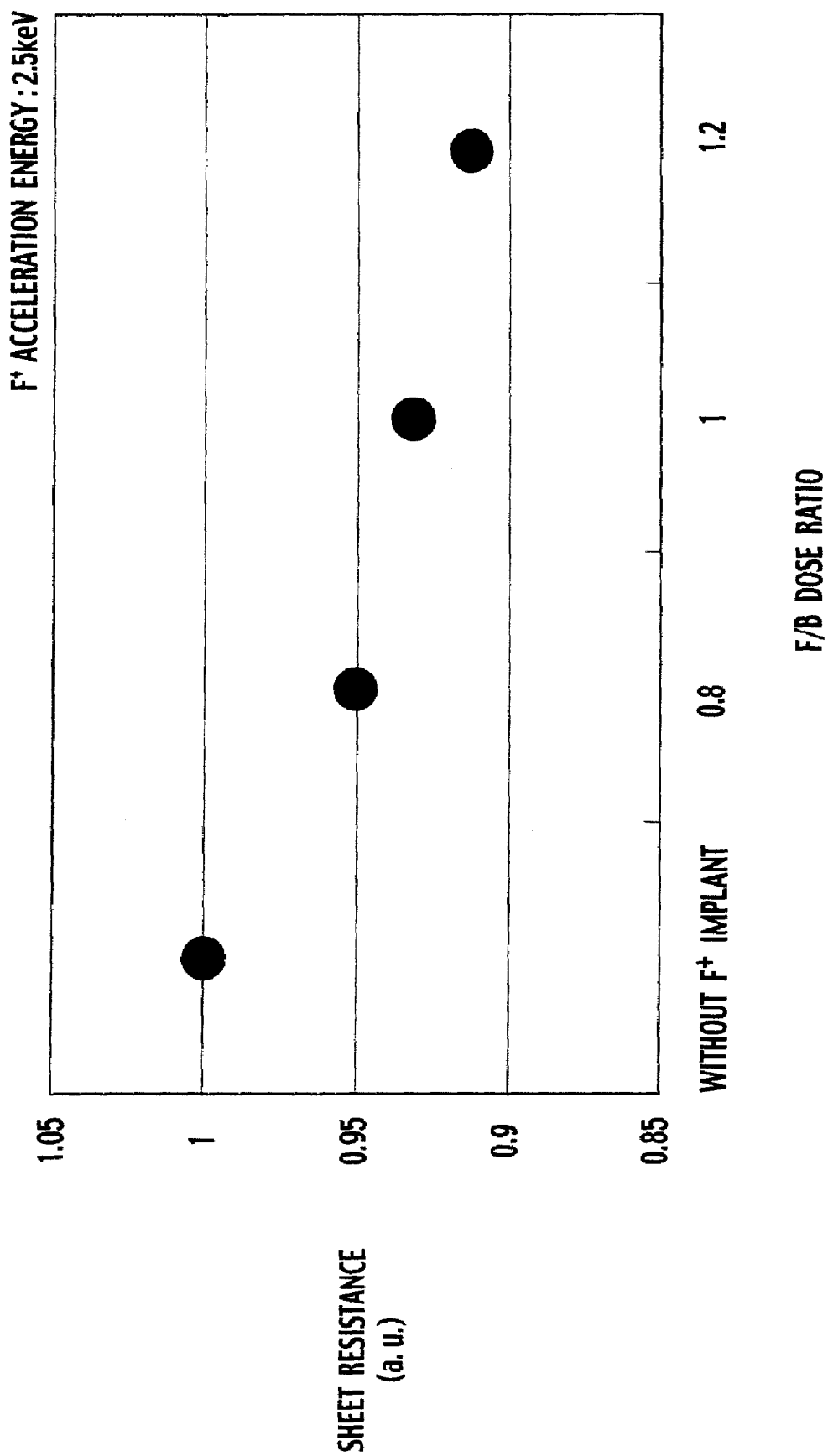
FIG. 18 is a diagram showing other example of a dependence of sheet resistances of active regions formed by B and F co-implantation, after activation annealing, on F/B dose ratio.

As shown in FIG. 17, when the F$^+$ acceleration energy is 2.5 keV, the diffusion depth of B is shallow compared with the comparative example without co-implantation. The concentration distribution of B remains virtually unchanged with F/B dose ratio of one or less. When the F/B dose ratio increases to 1.2, the diffusion depth of B is shallower. Sheet resistance Rs decreases in correlation with an increase in the F/B dose ratio, as shown in FIG. 18. With an F/B dose ratio of 1.2, sheet resistance decreases for about 10% compared to the comparative example.

In this manner, with both of the acceleration energy of 2.5 keV and seven keV, it is possible to suppress diffusion of B and to form an active region with low resistance by F/B dose ratio greater than one.

Figure 19:
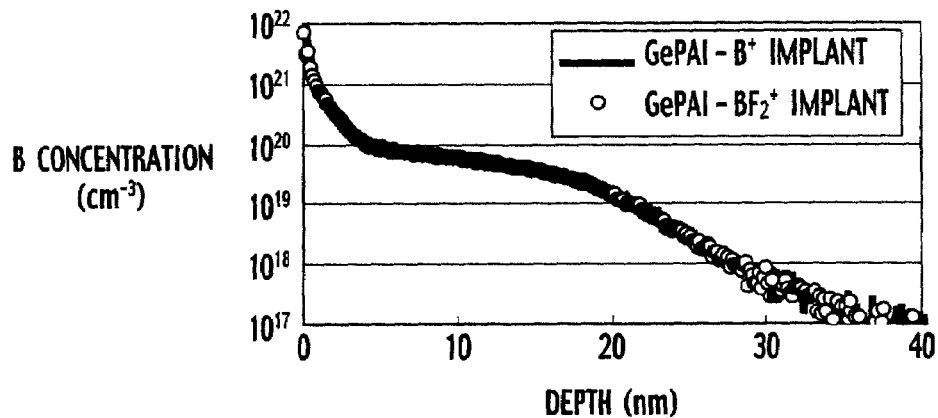
FIG. 19 is a diagram showing an example of B concentration distributions of active regions formed without $F^+$ implant, after activation annealing, using B and $BF_2$ as ion species.
Figure 20:
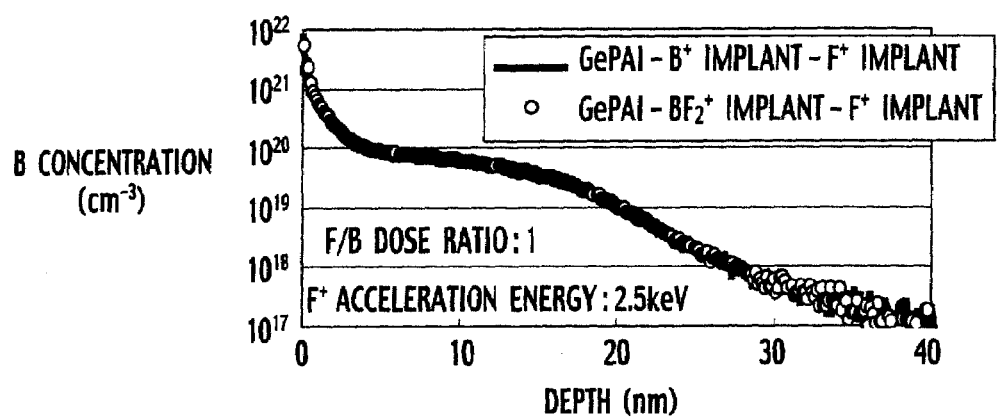
FIG. 20 is a diagram showing an example of B concentration distributions of active regions formed by B and F co-implantation at a F/B dose ratio of 1, after activation annealing, using B and $BF_2$ as ion species.
Figure 21:
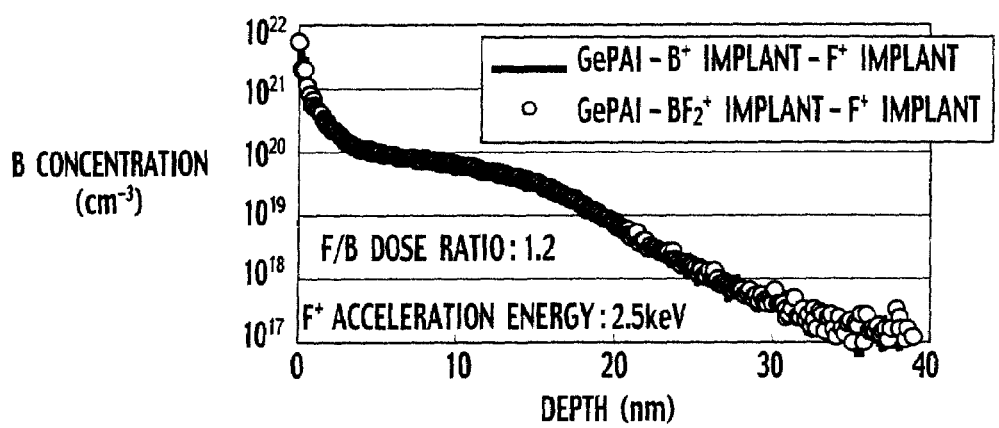
FIG. 21 is a diagram showing an example of B concentration distribution of an active region formed by B and F co-implantation at a F/B dose ratio of 1.2, after activation annealing, using B and $BF_2$ as ion species.
Figure 22:
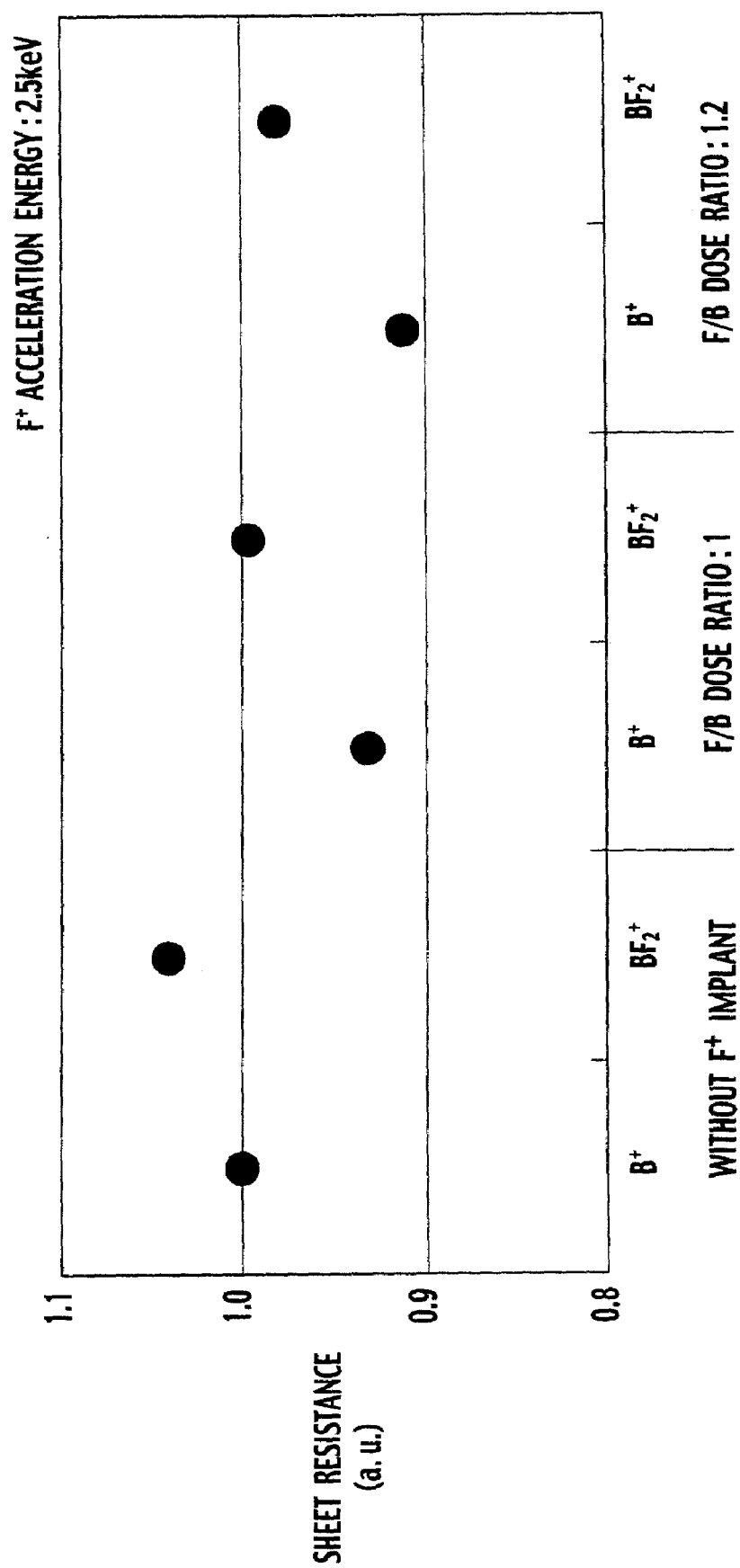
FIG. 22 is a diagram showing an example of a dependence of sheet resistances of active regions after activation annealing, on a F/B dose ratio, using B and $BF_2$ as ion species.

In the description put forth above, B$^+$ are used as an ion species of B which is the first impurity. However, it is also acceptable to use boron difluoride (BF$_2$) as an ion species of the first impurity. In a case using BF$_2^+$, acceleration energy is 1.5 keV to provide a projected range to be approximately two nm as with B$^+$. A dose of BF$_2^+$ is $1\times10^{15}$ cm$^{-2}$, which is the same as with B$^+$. As shown in FIGS. 19, 20, and 21, B concentration distributions of active regions formed by B$^+$ and BF$_2^+$ implants without F$^+$ implant, with F/B dose ratio of one, and with F/B dose ratio of 1.2, are consistent within a error range of SIMS measurement. Here, the F$^+$ acceleration energy is 2.5 keV. Each active region by B$^+$ implant without F$^+$ implant, as show in FIG. 22, with an F/B dose ratio of 1, and with an F/B dose ratio of 1.2, has a lower sheet resistance Rs compared to each active region by BF$_2^+$ implant. Specifically, in a case of co-implantation with F as the second impurity, it is desirable to use B$^+$ rather than BF$_2^+$ as an ion species of the first impurity.

Figure 23:
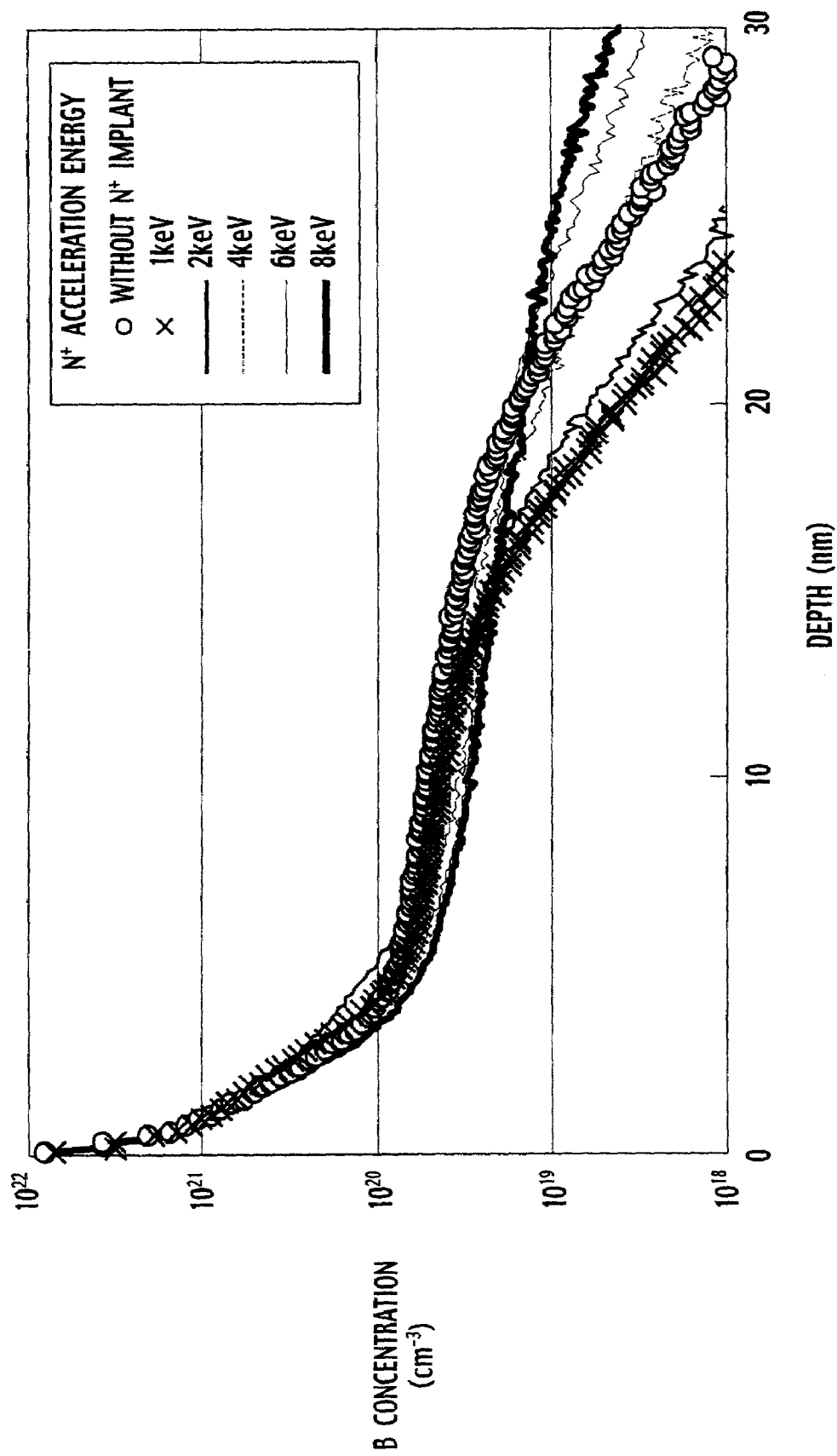
FIG. 23 is a diagram showing examples of B concentration distributions of active regions formed by B and N co-implantation, after activation annealing.

It is also possible to use N as the second impurity. In a case of co-implantation with N$^+$, diffusion depth of B in active regions increases due to the increases of N$^+$ acceleration energy, as shown in FIG. 23. Further, co-implantation dose ratio of N to B (hereinafter referred to as N/B dose ratio) at a B dose of $1\times10^{15}$ cm$^{-2}$ is one. The diffusion depth of B at N$^+$ acceleration energy of four keV is comparable to the comparative example without N$^+$ implant. At acceleration energy of two keV or less, diffusion of B is suppressed. At acceleration energy of six keV or more, diffusion depth of B not only increases, but concentrations of B in flat regions of B concentration distributions decrease.

Figure 24:
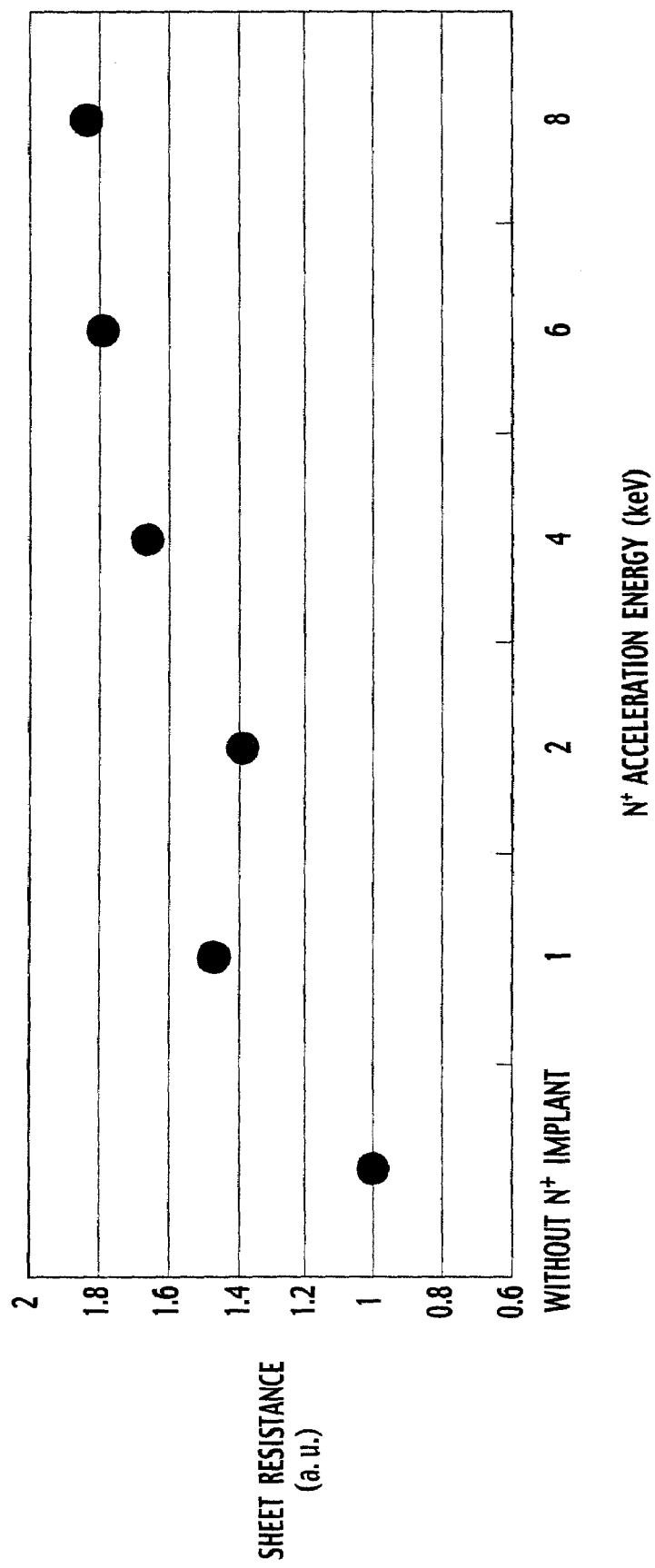
FIG. 24 is a diagram showing a dependence of sheet resistances of active regions formed by B and N co-implantation, on acceleration energy of N ions, after activation annealing.

There is a trend for sheet resistance Rs to increase in correlation with increases in acceleration energy, at N$^+$ acceleration energy above 2 keV or more, as shown in FIG. 24. Sheet resistances Rs of active regions formed at acceleration energy of one to two keV are 40% to 50% greater compared to the comparative example without N$^+$ implant. As shown in FIG. 23, in the active regions formed with an acceleration energy of 2 keV or less, sheet resistances Rs decrease regardless of decreases in diffusion depth of B, compared with the active regions formed with acceleration energy of four keV or more.

Figure 25:
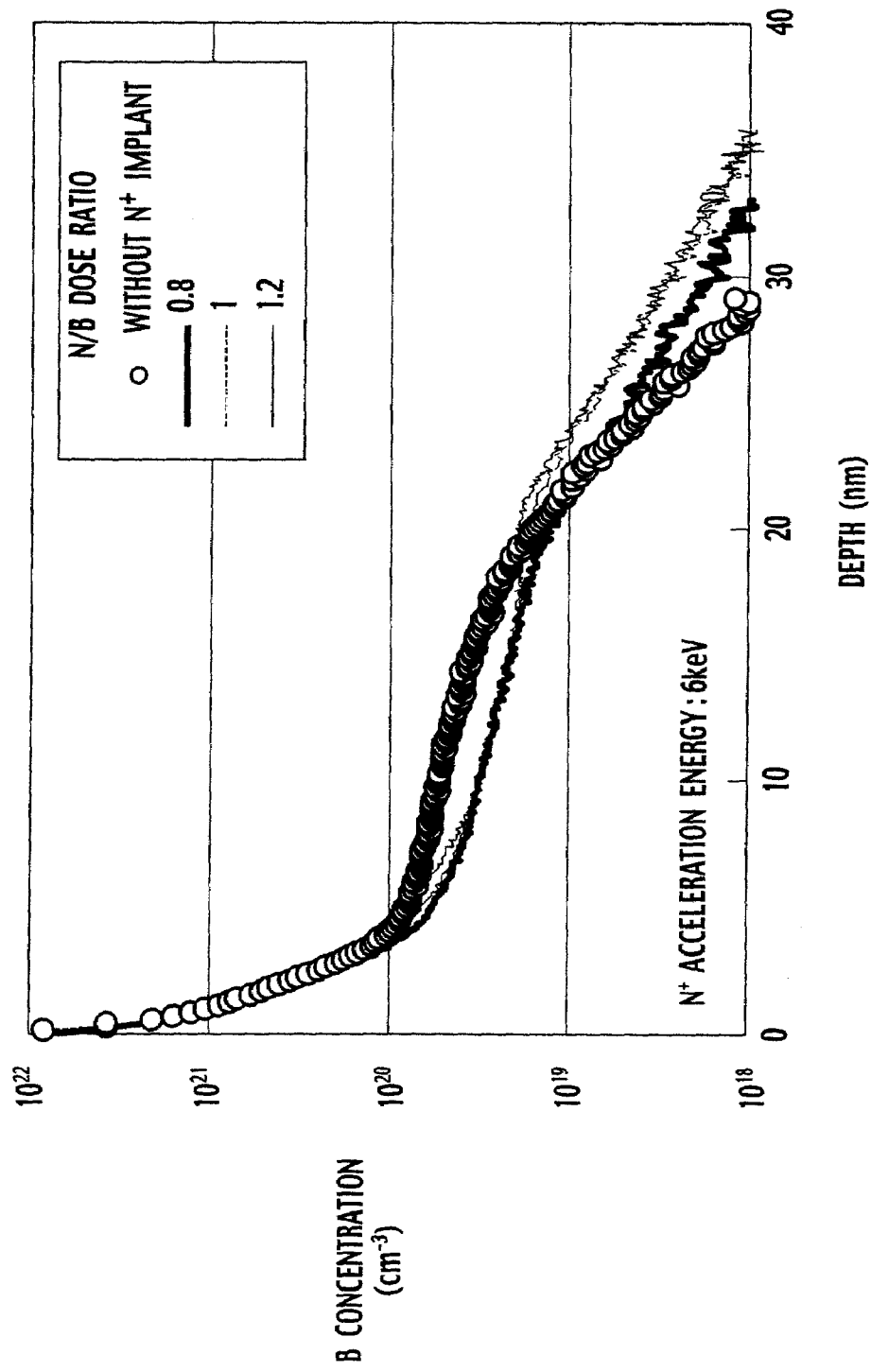
FIG. 25 is a diagram showing an example of a dependence of B concentration distributions of active regions formed by B and N co-implantation, after activation annealing, on a N/B dose ratio.
Figure 26:
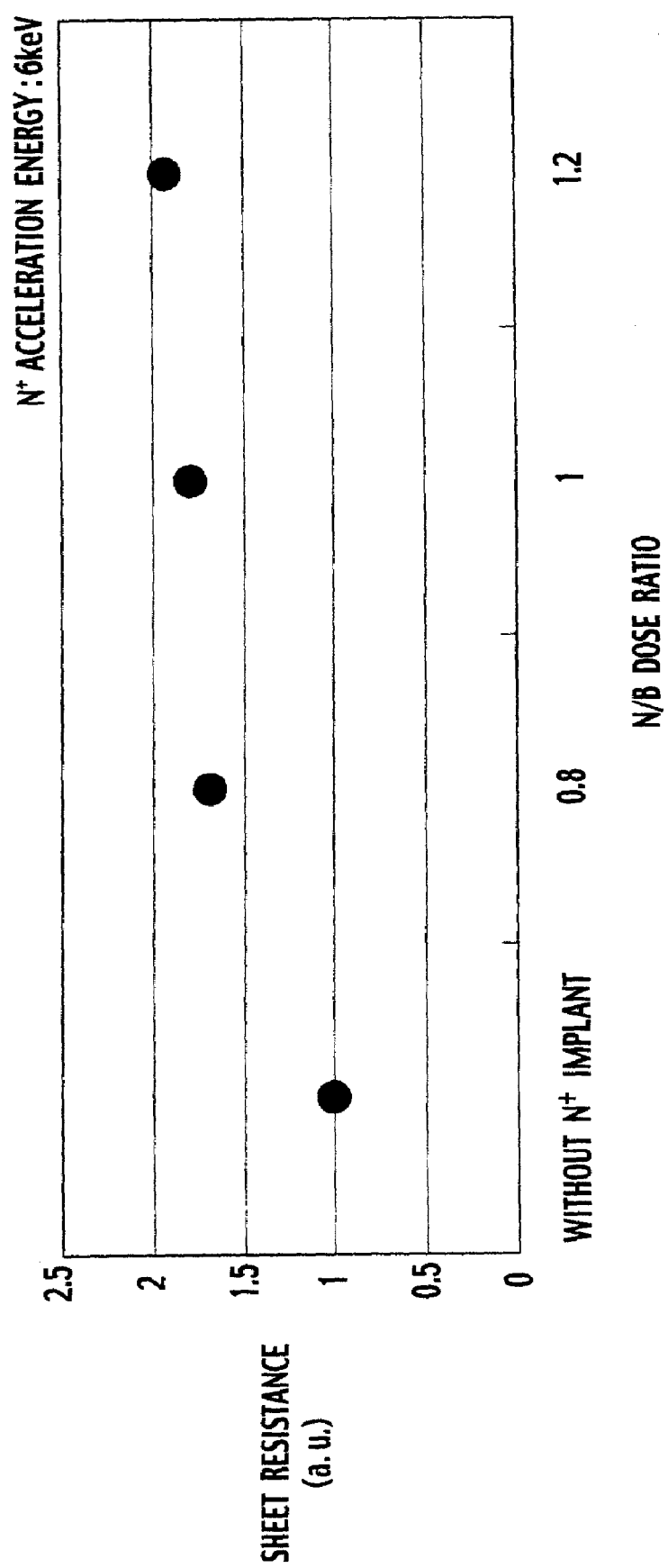
FIG. 26 is a diagram showing an example of a dependence of sheet resistances of active regions formed by B and N co-implantation, after activation annealing, on a N/B dose ratio.

As shown in FIG. 25, when N$^+$ acceleration energy is six keV, at N/B dose ratio of one or more, concentration distributions of B in the active regions remains virtually unchanged. Even at N/B dose ratio of 0.8, diffusion depth of B of the active region is deep compared with the comparative example. Sheet resistance Rs of the active region increases in correlation with increases in the N/B dose ratio, as shown in FIG. 26. Thus, no effectiveness may be provided with any N/B dose ratio, in case of co-implantation with N$^+$ at acceleration energy of six keV.

Figure 27:
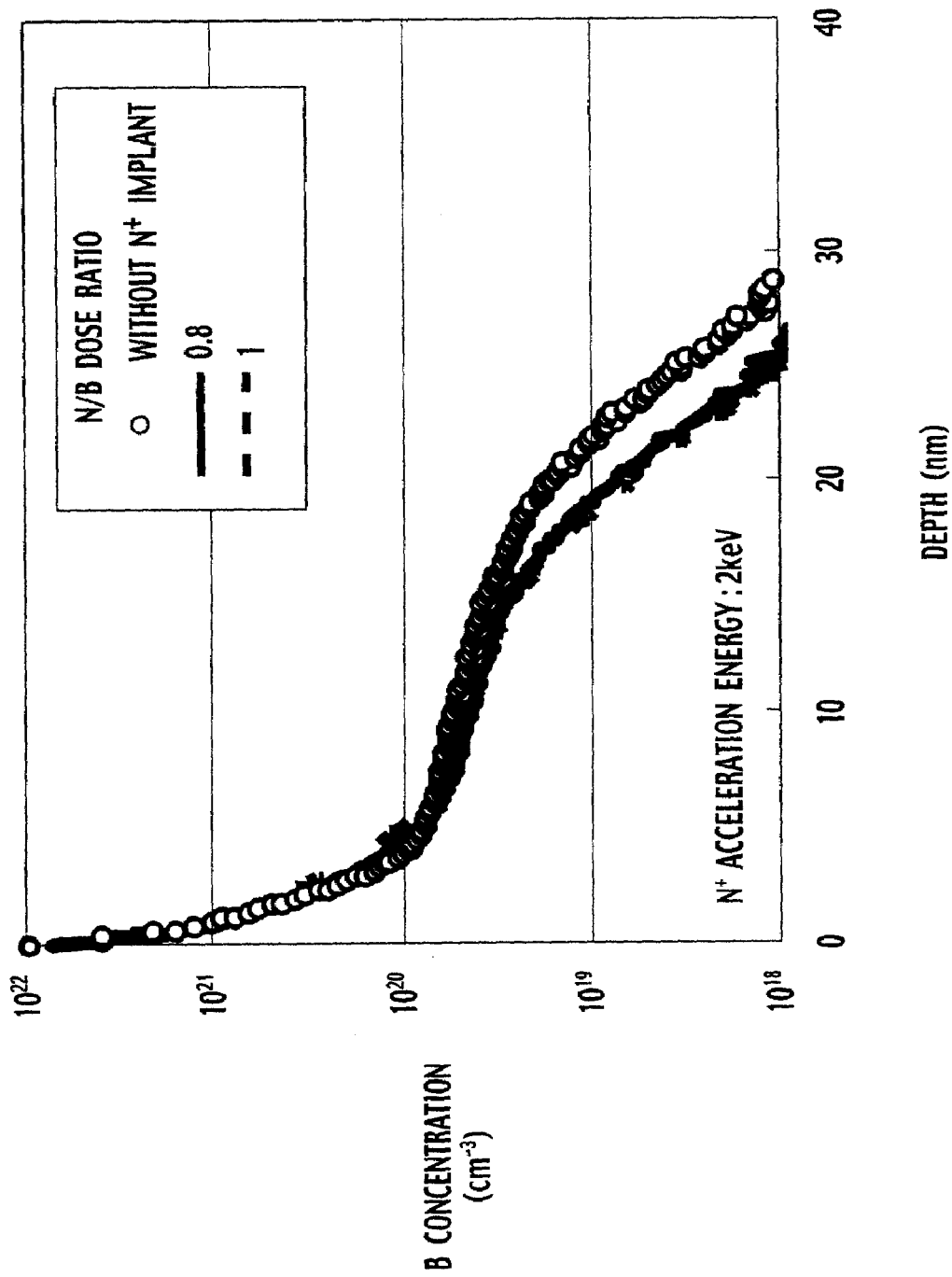
FIG. 27 is a diagram showing other example of a dependence of B concentration distributions of active regions formed by B and N co-implantation, after activation annealing, on a N/B dose ratio.
Figure 28:
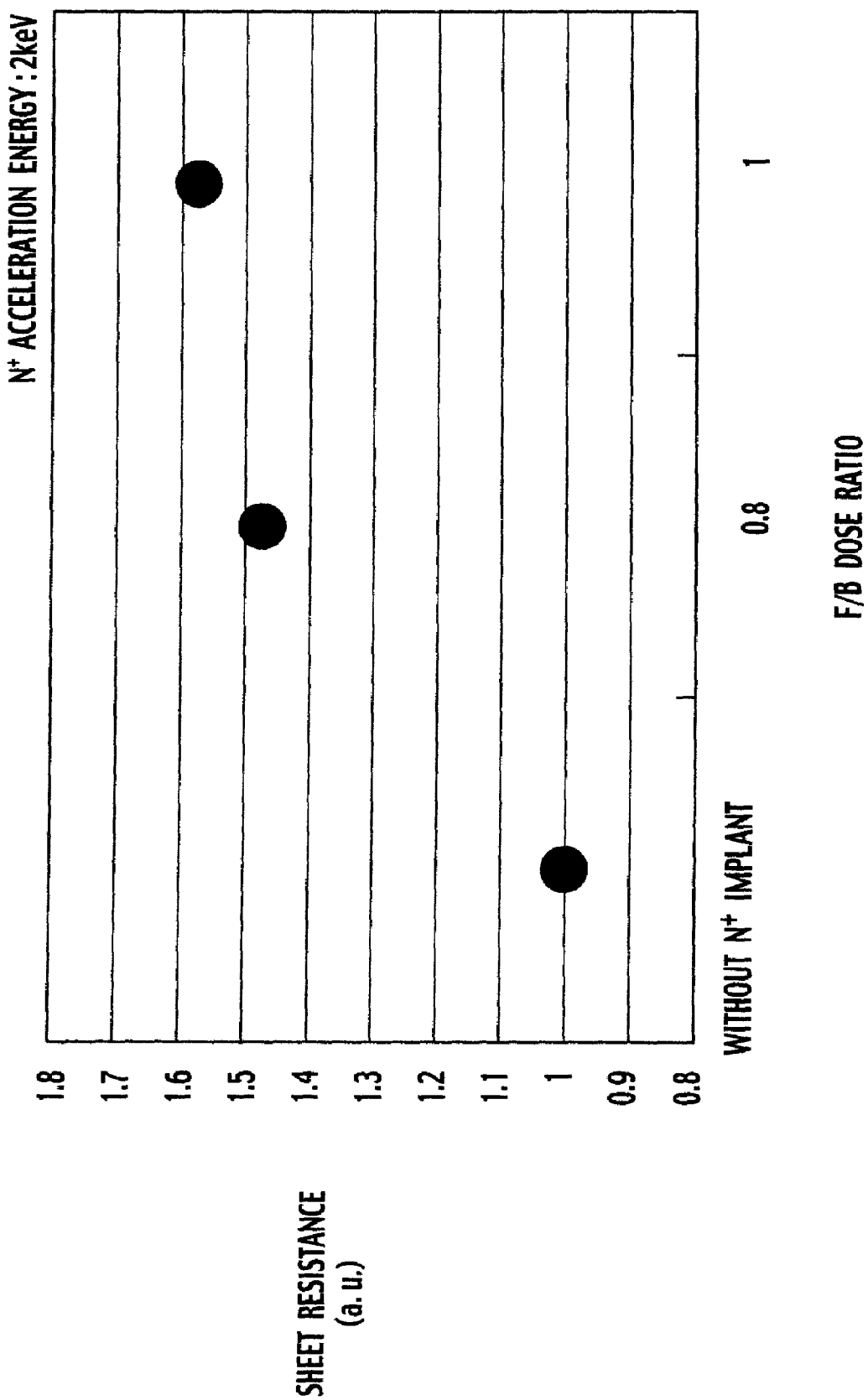
FIG. 28 is a diagram showing other example of a dependence of sheet resistances of active regions formed by B and N co-implantation, after activation annealing, on a N/B dose ratio.

As shown in FIG. 27, when N$^+$ acceleration energy is two keV, at N/B dose ratio of one or less, diffusion of B of the active region is suppressed. At N/B dose ratios of 0.8 and 1, concentration distributions of B in the active regions remains virtually unchanged. Sheet resistance Rs of the active region is lower with N/B dose ratio of 0.8, as shown in FIG. 28. Thus, it is desirable to have N/B dose ratio of less than one in case of co-implantation with N$^+$ at acceleration energy of 2 keV or less.

Figure 29:
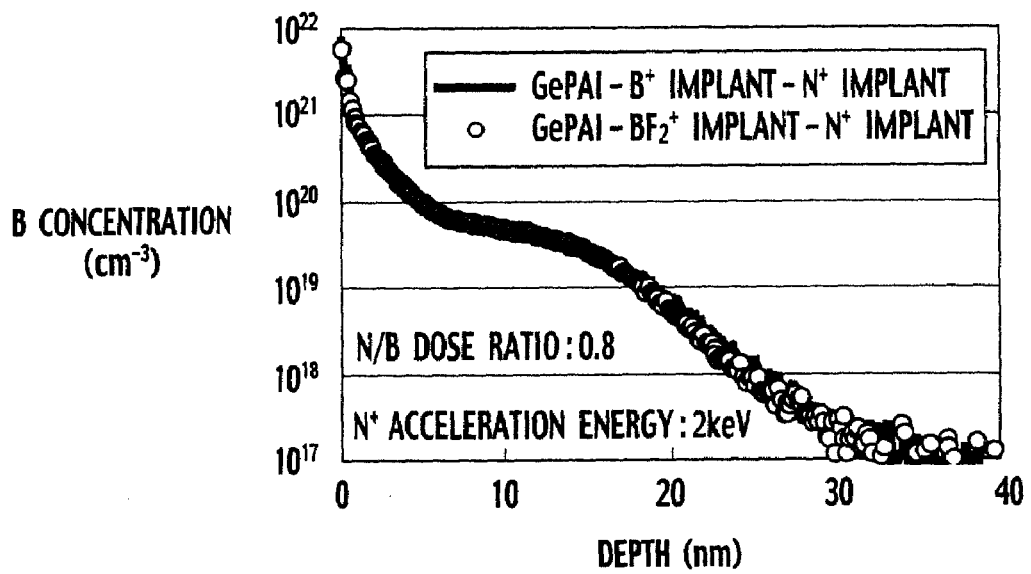
FIG. 29 is a diagram showing examples of B concentration distributions of active regions formed after activation annealing at a N/B dose ratio of 0.8, using B and $BF_2$ as ion species.
Figure 30:
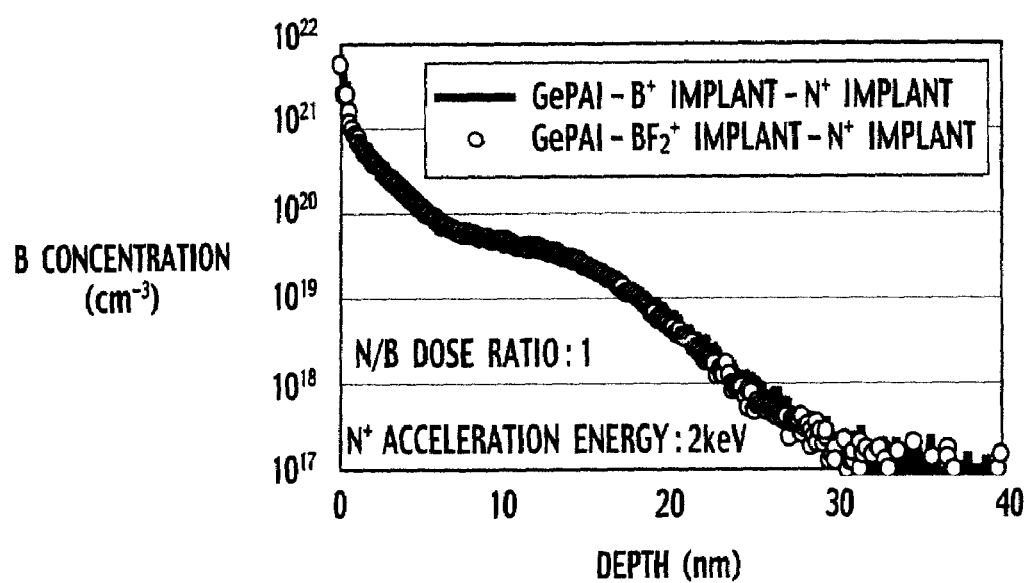
FIG. 30 is a diagram showing examples of B concentration distributions of active regions formed after activation annealing at a N/B ratio of 1, using B and $BF_2$ as ion species.
Figure 31:
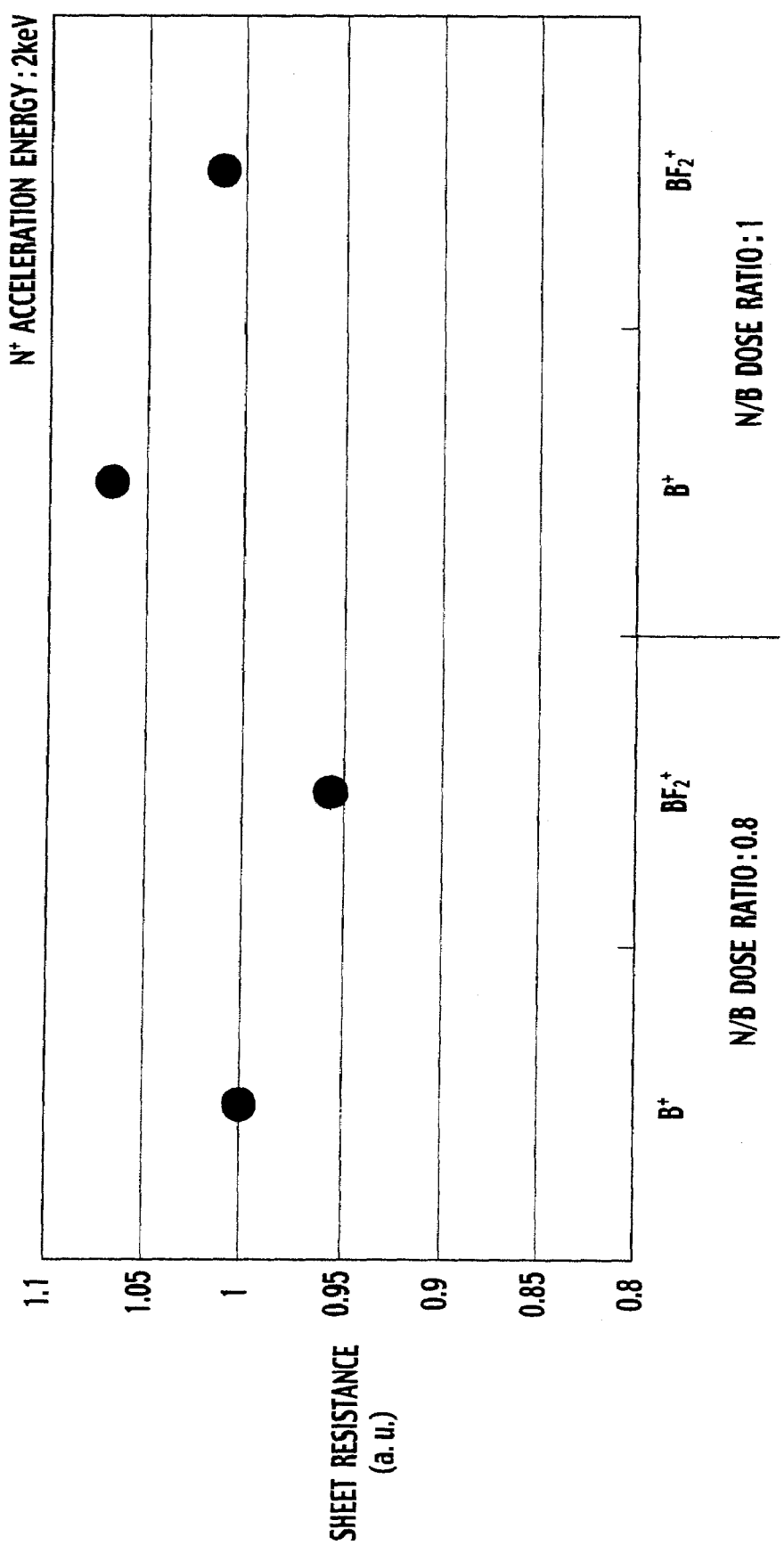
FIG. 31 is a diagram showing an example of a dependence of sheet resistances of active regions formed after activation annealing using B and $BF_2$ as ion species, on N/B dose ratio.

Further, it is acceptable to co-implant with N$^+$, using BF$_2^+$ as an ion species projected of the first impurity. BF$_2^+$ acceleration energy is 1.5 keV to provide a projected range to be approximately two nm, in the same manner as with B$^+$. A dose of BF$_2^+$ is $1\times10^{15}$ cm$^{-2}$, which is the same as with B$^+$. The B concentration distributions of active regions formed by co-implantation of B$^+$ or BF$_2^+$ with N$^+$ are consistent within an error range of SIMS measurement with respective N/B dose ratio of 0.8 and one, as shown in FIGS. 29 and 30. The active regions formed by BF$_2^+$ implant have lower sheet resistances Rs with respective N/B dose ratio of 0.8 and one, compared to the active regions formed by B$^+$ implant, as shown in FIG. 31. Specifically, in a case of co-implantation with N as the second impurity, it is desirable to use BF$_2^+$ rather than B$^+$ as an ion species of the first impurity.

Next, a semiconductor device manufacturing method according to the embodiment will be described using a manufacturing process for a p-channel metal-insulator-semiconductor (pMIS) transistor as an example. However, the semiconductor device is not limited to a pMIS transistor. It is acceptable to use an n-channel MIS (nMIS) transistor, a complementary MIS (CMIS) transistor and the like, as the semiconductor device. In a case using an nMIS transistor, P is used as the first impurity. Also, a silicon oxynitride (SiON) film is described as an insulating film. However, an insulating film is not limited to an SiON film. For instance, it is acceptable to use an SiO$_2$ film, an Si$_3$N$_4$ film, and the like, as an insulating film. It is also acceptable to use a composite insulating film among an SiO$_2$ film, an SiON film, an Si$_3$N$_4$ film, and various metal oxide films.

Figure 32:
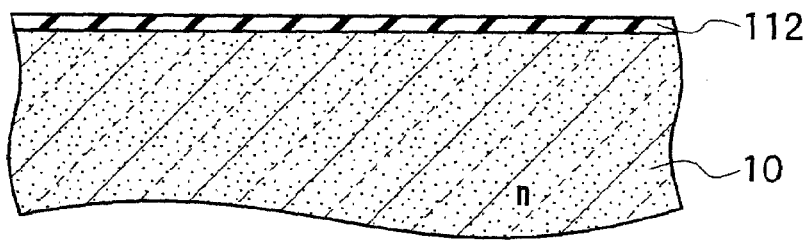
FIGS. 32 to 41 are cross sectional views showing an example of a manufacturing method of a semiconductor device according to the embodiment of the invention.
Figure 33:
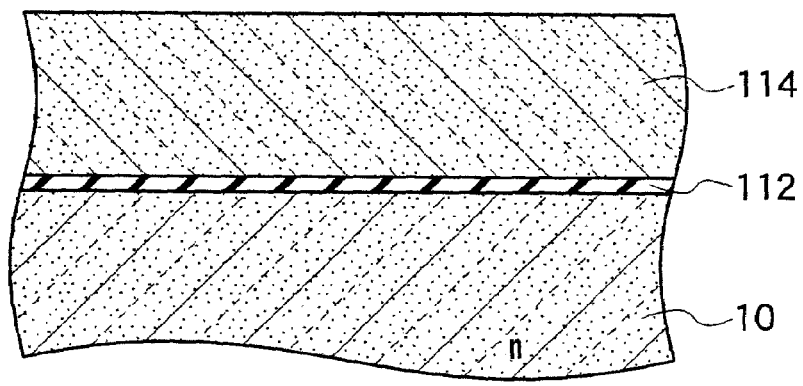
Figure 34:
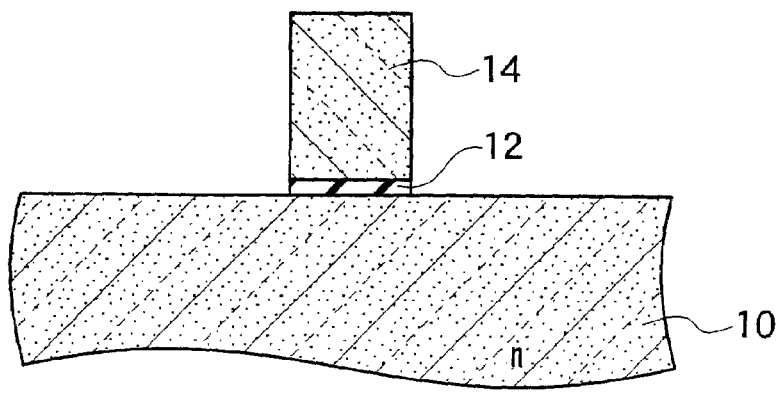

As shown in FIG. 32, an SiO$_2$ film is formed at a thickness of approximately one nm for instance, on a surface of an n-type Si semiconductor substrate 10 by rapid thermal oxidation (RTO). Afterward, an insulating film 112 of an SiON film having an effective oxide thickness (EOT) of approximately 1.3 nm is formed by plasma nitridation and the like. Herein, EOT represents the thickness of the film converted into an SiO$_2$ film. As shown in FIG. 33, a conducting film 114 of polycrystalline Si (poly-Si) is deposited on the insulating film 112 by chemical vapor deposition (CVD). The conducting film 114 and the insulating film 112 are processed by photolithography and reactive ion etching (RIE) to delineate a gate electrode 14 and a gate insulating film 12, as shown in FIG. 34.

Figure 35:
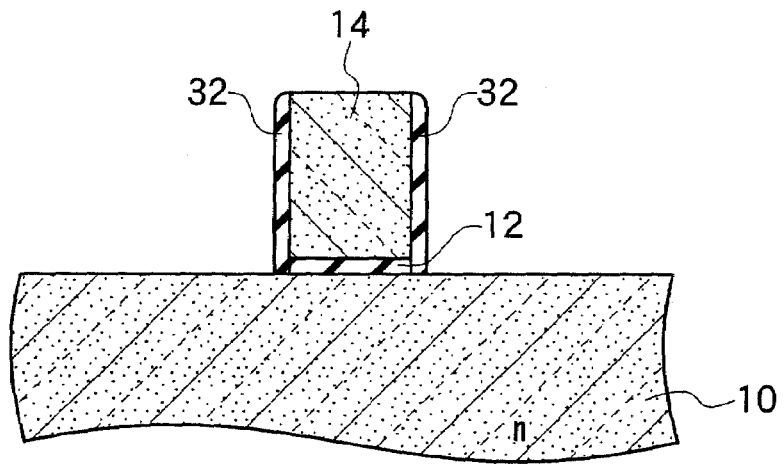

An SiO$_2$ film of approximately one to two nm, for example, is formed on an exposed surface of the gate electrode 14 and the semiconductor substrate 10 by RTO. An SiO$_2$ film is then deposited by CVD on the formed SiO$_2$ film using tetraetoxysilane (TEOS) and the like. The deposited SiO$_2$ film is selectively removed by directional etching such as RIE, forming an offset spacer 32 on side walls of the gate electrode 14 and the gate insulating film 12, as shown in FIG. 35.

Figure 36:
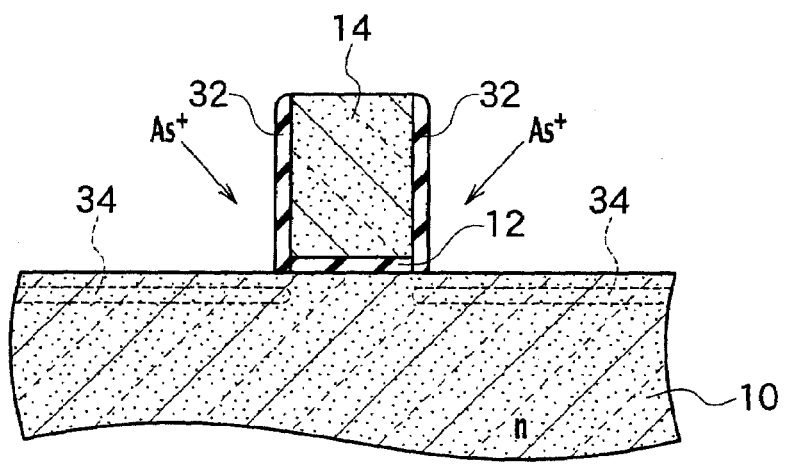

As shown in FIG. 36, halo impurity implanted regions 34 are formed by tilt angle implantation of As ions, using the gate electrode 14 and the offset spacer 32 as masks. Tilt angle implantation conditions are an acceleration energy of 50 keV, dose of $2.5\times10^{13}$ cm$^{-2}$, and a tilt angle of 30 degrees, for example. The projected range of As is approximately 25 to 30 nm from the surface of the semiconductor substrate.

Figure 37:
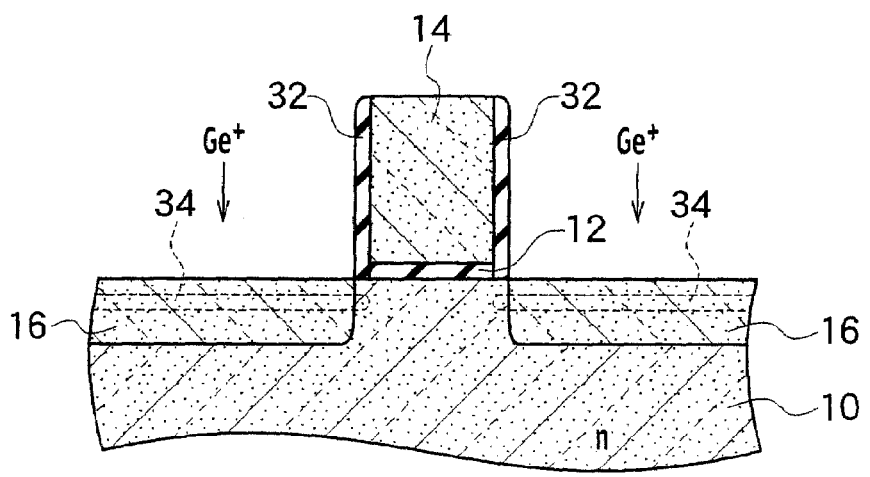

As shown in FIG. 37, amorphous regions 16 are formed at a depth of approximately 16 nm from the surface of the semiconductor substrate 10 by Ge PAI, using the gate electrode 14 and the offset spacer 32 as masks. Ion implantation conditions are an acceleration energy of 5 keV and a dose of $1\times10^{15}$ cm$^{-2}$. The projected range of Ge is approximately eight nm from the surface of the semiconductor substrate.

Figure 38:
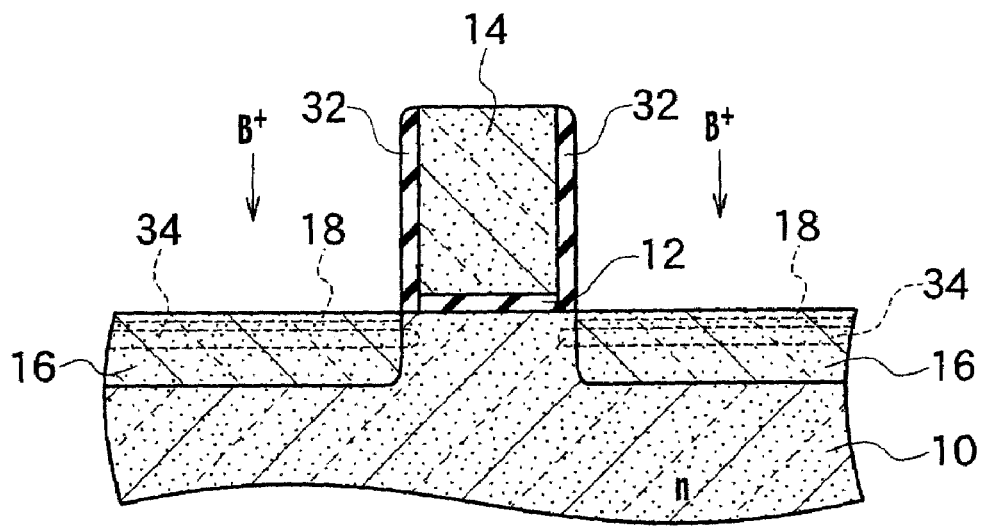

As shown in FIG. 38, first impurity implanted regions 18 are formed on both sides of the gate insulating film 12 by B$^+$ implantation into the amorphous regions 16 using the gate electrode 14 and the offset spacer 32 as masks. Ion implantation conditions are an acceleration energy of 0.2 keV and a dose of $1\times10^{15}$ cm$^{-2}$. The projected range of B is approximately two nm from the surface of the amorphous region 16.

Figure 39:
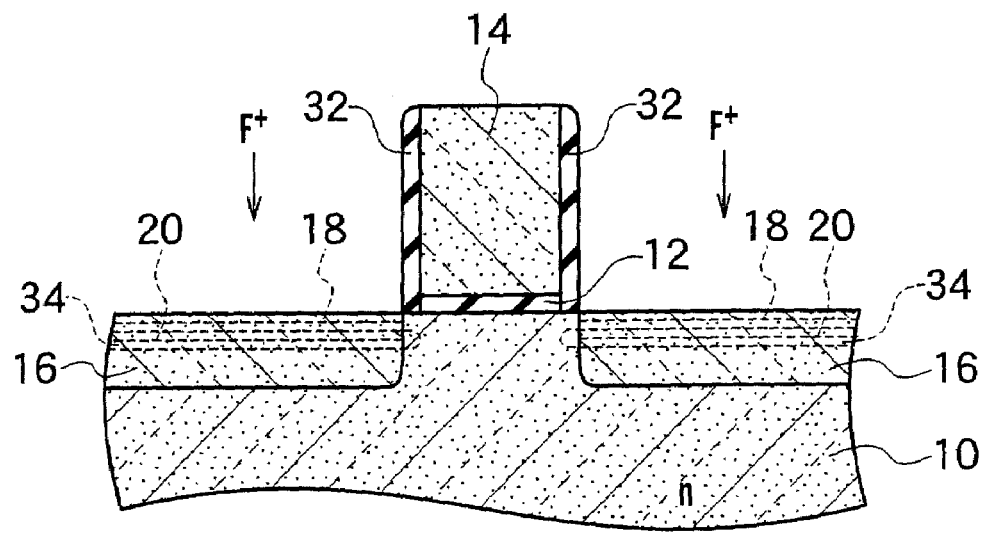

As shown in FIG. 39, F ions are co-implanted into the first impurity implanted regions 18 formed in the amorphous regions 16, using the gate electrode 14 and the offset spacer 32 as masks. Second impurity implanted regions 20 are formed on both sides of the gate insulating film 12 by F$^+$ implant. Ion implantation conditions are an acceleration energy of 2.5 keV and a dose of $1\times10^{15}$ cm$^{-2}$. The projected range of F is approximately eight nm from the surface of the amorphous region 16.

Figure 40:
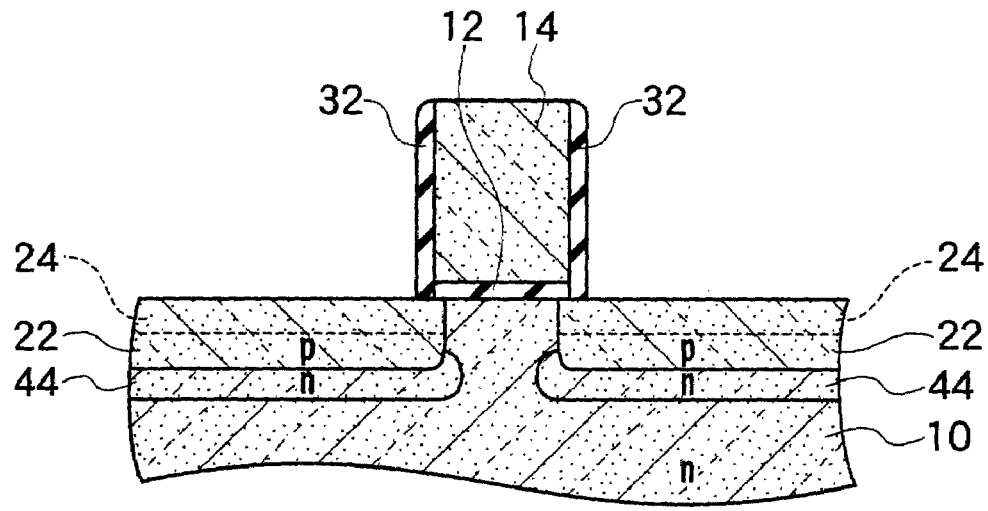

Activation annealing of the implanted B is executed by RTA, at approximately 800° C. to 900° C. for five seconds. As shown in FIG. 40, the B ions implanted into the first impurity implanted regions 18 are electrically activated by RTA while diffusing to form p-type extension regions 22 (first diffusion regions). Additionally, As ions implanted into the halo impurity implanted regions 34 shown in FIG. 39, are electrically activated while diffusing to form n-type halo regions 44. The halo regions 44 contact the extension regions 22, and are formed around the extension regions 22. Additionally, the amorphous regions 16 are re-crystallized by activation annealing. Furthermore, a channel region is formed between the extension regions 22.

Figure 41:
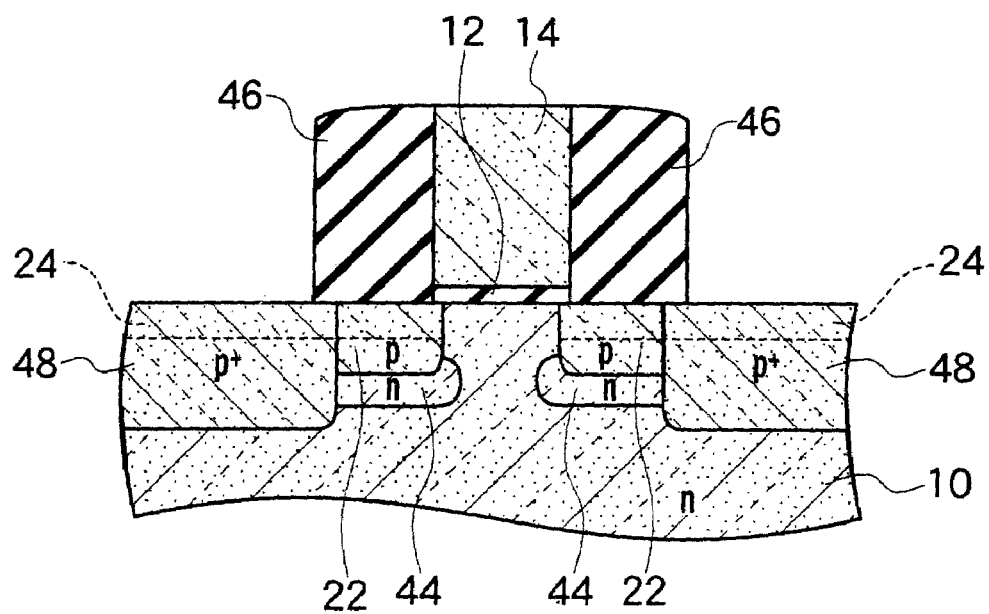

A multi-layered insulating film of an SiO$_2$ film, an Si$_3$N$_4$ film, and a borosilicate glass (BSG), and the like, is deposited in sequence on the extension regions 22 by CVD. CVD temperature is between approximately 650° C. to 700° C. The multi-layered insulating film is then selectively removed by directional etching such as RIE, forming a sidewall spacer 46 on side walls of the gate insulating film 12 and the gate electrode 14, as shown in FIG. 41. B ions are implanted from the surface of the extension regions 22, using the gate electrode 14 and the sidewall spacer 46 as masks. Ion implantation conditions are an acceleration energy of four keV and a dose of $3\times10^{15}$ cm$^{-2}$. Next, activation annealing at approximately 1000° C. to 1080° C. is executed by spike RTA. As a result, p-type source/drain regions 48 are formed deeper than the halo regions 44 on both sides of the sidewall spacer 46, as shown in FIG. 41. The extension regions 22 include second diffusion regions 24 in which the F ions are diffused on the surface side of the extension regions 22.

An interlevel insulating film of SiO$_2$, for example, is deposited on the surface of the source/drain regions 48 on top of the semiconductor substrate 10. Contact holes are then opened in the interlevel insulating film on top of the gate electrode 14 and the source/drain regions 48. Wirings are connected to the gate electrode 14 and the source/drain regions 48 through each of the contact holes. Thus, A semiconductor device is manufactured.

According to a semiconductor manufacturing method of the embodiment, the amorphous regions 16 are formed by Ge PAI, as shown in FIG. 37. Also, the extension regions 22 are formed by B and F co-implantation into the amorphous regions 16, as shown in FIGS. 38 and 39. As a result, diffusion of B may be suppressed, and it becomes possible to form extension regions having shallow pn junctions with low resistance.

Other Embodiments

In the description of the embodiment of the present invention, a pn junction is formed inside of the n-type semiconductor substrate 10. However, it is also acceptable to form a pn junction in a well provided in the n-type or p-type semiconductor substrate 10. For example, it is acceptable to form a pn junction by ion implantation of p-type impurities such as B, in an n-well formed by ion implantation of n-type impurities such as As. It is also acceptable to form a pn junction by ion implantation of n-type impurities such as P, in a p-well formed by ion implantation of p-type impurities such as B.

In the description of the embodiment, an Si substrate is used as the semiconductor substrate 10. However, the semiconductor substrate 10 is not limited to an Si substrate. It is acceptable to use a Si-on Insulator (SOI) substrate. It is also acceptable to use a group IV alloyed crystal substrate such as silicon carbide (SiC), silicon germanium (SiGe), silicon germanium carbon (SiGeC) as the semiconductor substrate 10.

Various modifications will become possible for those skilled in the art after storing the teachings of the present disclosure without departing from the scope thereof.

What is claimed is:

1. A manufacturing method for a semiconductor device, comprising:
    forming an amorphous region in a surface region of a semiconductor substrate by implanting one of germanium ions and silicon ions;
    implanting ions of first impurity atoms into the amorphous region, the first impurity atoms contributing to electric conductivity;
    implanting ions of second impurity atoms into the amorphous region, the second impurity atoms not contributing to the electric conductivity; and
    activating the ions of the first impurity atoms by annealing the surface region of the semiconductor substrate,
    wherein the first impurity atoms are boron atoms and the second impurity atoms are fluorine atoms.

2. The method of claim 1, wherein a dose ratio of the first impurity atoms to the second impurity atoms is less than one.

3. A manufacturing method for a semiconductor device, comprising:
    forming an amorphous region in a surface region of a semiconductor substrate by implanting one of germanium ions and silicon ions;
    implanting ions of first impurity atoms into the amorphous region, the first impurity atoms contributing to electric conductivity;
    implanting ions of second impurity atoms into the amorphous region, the second impurity atoms not contributing to the electric conductivity; and
    activating the ions of the first impurity atoms by annealing the surface region of the semiconductor substrate,
    wherein the first impurity atoms are boron difluoride atoms and the second impurity atoms are fluorine atoms.

4. A manufacturing method for a semiconductor device, comprising:
    forming an amorphous region in a surface region of a semiconductor substrate by implanting one of germanium ions and silicon ions;

implanting ions of first impurity atoms into the amorphous region, the first impurity atoms contributing to electric conductivity;

implanting ions of second impurity atoms into the amorphous region, the second impurity atoms not contributing to the electric conductivity; and activating the ions of the first impurity atoms by annealing the surface region of the semiconductor substrate, wherein the first impurity atoms are boron difluoride atoms, wherein the second impurity atoms are nitrogen atoms, and wherein a dose ratio of the first impurity atoms to the second impurity atoms is greater than one.

5. The method of claim 1, wherein a depth of implantation of the ions of the first impurity atoms is more shallow than a depth of the amorphous region.

6. The method of claim 1, wherein a depth of implantation of the ions of the second impurity atoms is more shallow than a depth of the amorphous region, and deeper than a depth of implantation of the ions of the first impurity atoms.

7. The method of claim 1, wherein the first impurity atoms are activated by rapid thermal annealing.

8. The method of claim 1, wherein the amorphous region is formed by a gate electrode of a metal-insulator-semiconductor fabricated on the semiconductor substrate as a mask.

9. The method of claim 8, wherein the first impurity atoms are activated so as to form an extension region on both sides of a gate insulating film provided below the gate electrode.

10. The method of claim 3, wherein a dose ratio of the first impurity atoms to the second impurity atoms is less than one.

11. The method of claim 3, wherein a depth of implantation of the ions of the first impurity atoms is more shallow than a depth of the amorphous region.

12. The method of claim 3, wherein a depth of implantation of the ions of the second impurity atoms is more shallow than a depth of the amorphous region, and deeper than a depth of implantation of the ions of the first impurity atoms.

13. The method of claim 3, wherein the first impurity atoms are activated by rapid thermal annealing.

14. The method of claim 3, wherein the amorphous region is formed by a gate electrode of a metal-insulator-semiconductor fabricated on the semiconductor substrate as a mask.

15. The method of claim 3, wherein the first impurity atoms are activated so as to form an extension region on both sides of a gate insulating film provided below the gate electrode.

16. The method of claim 4, wherein a depth of implantation of the ions of the first impurity atoms is more shallow than a depth of the amorphous region.

17. The method of claim 4, wherein a depth of implantation of the ions of the second impurity atoms is more shallow than a depth of the amorphous region, and deeper than a depth of implantation of the ions of the first impurity atoms.

18. The method of claim 4, wherein the first impurity atoms are activated by rapid thermal annealing.

19. The method of claim 4, wherein the amorphous region is formed by a gate electrode of a metal-insulator-semiconductor fabricated on the semiconductor substrate as a mask.

20. The method of claim 19, wherein the first impurity atoms are activated so as to form an extension region on both sides of a gate insulating film provided below the gate electrode.

* * * * *